US012805220B2

(12) United States Patent

Jung et al.

(10) Patent No.: US 12,805,220 B2

(45) Date of Patent: Nov. 17, 2026

(54) METHOD AND SYSTEM FOR PROCESSING SUBSTRATES

(71) Applicant: Samsung Electronics Co., Ltd., Suwon-si (KR)

(72) Inventors: Jaehee Jung, Suwon-si (KR); Seik Jang, Suwon-si (KR); Jaeseok Kim, Suwon-si (KR); Hyungkyu Kim, Suwon-si (KR); Seungjin Baek, Suwon-si (KR); Changsun Yeo, Suwon-si (KR); Kwangjin Yoo, Suwon-si (KR); Jinhwan Jeong, Suwon-si (KR); Hyeonjeong Jung, Suwon-si (KR); Wonchul Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 446 days.

(21) Appl. No.: 18/512,923

(22) Filed: Nov. 17, 2023

(65) Prior Publication Data

US 2024/0282573 A1 Aug. 22, 2024

(30) Foreign Application Priority Data

Feb. 21, 2023 (KR) ........................ 10-2023-0023027
Jun. 2, 2023 (KR) ........................ 10-2023-0071870

(51) Int. Cl.

*H10P 14/60* (2026.01)
*C23C 16/04* (2006.01)

(Continued)

(52) U.S. Cl.

CPC ........ *H10P 14/6339* (2026.01); *C23C 16/042* (2013.01); *C23C 16/402* (2013.01);

(Continued)

(58) Field of Classification Search

CPC .................................................. H10P 14/6336

See application file for complete search history.

(56) References Cited

U.S. PATENT DOCUMENTS 9,865,459 B2 1/2018 Cheng et al.
9,892,909 B2 2/2018 Fukiage et al.

(Continued)

FOREIGN PATENT DOCUMENTS

KR 10-2009-0057487 A 6/2009

*Primary Examiner* — Benjamin P Sandvik

(74) *Attorney, Agent, or Firm* — Muir Patent Law, PLLC

(57) ABSTRACT

A method for processing a substrate including: loading a plurality of first substrates and a plurality of second substrates on which mask patterns are formed into a process chamber; supplying a first pretreatment gas into the process chamber; surface processing the plurality of first substrates using first plasma generated from the first pretreatment gas; supplying a second pretreatment gas into the process chamber; surface processing the plurality of first substrates and the plurality of second substrates using second plasma generated from the second pretreatment gas; supplying precursors to be adsorbed onto each of the plurality of first substrates and the plurality of second substrates into the process chamber; supplying a reactive gas into the process chamber; and depositing a thin film covering the mask patterns on each of the plurality of first substrates and the plurality of second substrates using third plasma generated from the reactive gas and the precursors.

18 Claims, 24 Drawing Sheets

(51) Int. Cl.

| | |
|---|---|
| ***C23C 16/40*** | (2006.01) |
| ***C23C 16/458*** | (2006.01) |
| ***C23C 16/50*** | (2006.01) |
| ***H01J 37/32*** | (2006.01) |
| ***H10P 14/692*** | (2026.01) |
| ***H10P 50/00*** | (2026.01) |

(52) U.S. Cl.
CPC .......... *C23C 16/4583* (2013.01); *C23C 16/50* (2013.01); *H01J 37/32449* (2013.01); *H10P 14/6336* (2026.01); *H10P 14/69215* (2026.01); *H10P 50/71* (2026.01); *H01J 2237/332* (2013.01)

(56) References Cited

U.S. PATENT DOCUMENTS

| | | | |
|---|---|---|---|
| 10,340,136 | B1 | 7/2019 | Agnew et al. |
| 10,573,512 | B2 | 2/2020 | Oyama et al. |
| 11,289,326 | B2 | 3/2022 | Blanquart |
| 2002/0098627 | A1 | 7/2002 | Pomarede et al. |
| 2007/0231746 | A1 | 10/2007 | Tordanoglou et al. |
| 2011/0244690 | A1* | 10/2011 | Shanker .................. C23C 16/44 257/E21.249 |
| 2012/0049377 | A1 | 3/2012 | Yang et al. |
| 2017/0186606 | A1* | 6/2017 | Fukiage .............. H10P 14/6336 |
| 2017/0314129 | A1 | 11/2017 | Karim et al. |
| 2019/0177845 | A1* | 6/2019 | Baek ................. C23C 16/45517 |
| 2021/0050208 | A1* | 2/2021 | Sato .................... H10P 14/6336 |
| 2023/0395372 | A1* | 12/2023 | Yamada .................. C23C 16/04 |

* cited by examiner

METHOD AND SYSTEM FOR PROCESSING SUBSTRATES

CROSS-REFERENCE TO RELATED APPLICATION(S)

This application claims benefit of priority to Korean Patent Application Nos. 10-2023-0023027, filed on Feb. 21, 2023, and 10-2023-0071870, filed on Jun. 2, 2023, in the Korean Intellectual Property Office, the disclosures of both of which are incorporated herein by reference in their entireties.

BACKGROUND

The present inventive concept relates to a method and system for processing a substrate.

In order to manufacture a semiconductor device, a series of processes such as deposition, etching, and cleaning may be performed. These processes may be performed through a substrate processing apparatus such as a deposition device, an etching device, or a cleaning device having a process chamber. For example, in the case of a deposition process for forming a high-quality thin film (e.g., silicon oxide film), an atomic layer deposition (ALD) method in which two or more reactive materials are temporally separated and sequentially applied to a substrate to grow a thin film through surface reaction, and this is repeatedly performed to form a thin film having a desired thickness, is used.

SUMMARY

An aspect of the present inventive concept is to provide a method and system for processing a substrate in which a difference in consumption between a plurality of substrates is reduced when forming a thin film.

According to an aspect of the present inventive concept, provided is a method for processing a substrate, the method including: loading a plurality of first substrates and a plurality of second substrates on which mask patterns are formed into a process chamber: supplying a first pretreatment gas into the process chamber; surface processing the plurality of first substrates using first plasma generated from the first pretreatment gas: supplying a second pretreatment gas into the process chamber; surface processing the plurality of first substrates and the plurality of second substrates using second plasma generated from the second pretreatment gas: supplying precursors to be adsorbed onto each of the plurality of first substrates and the plurality of second substrates into the process chamber: supplying a reactive gas into the process chamber; and depositing a thin film covering the mask patterns on a surface of each of the plurality of first substrates and the plurality of second substrates using third plasma generated from the reactive gas and the precursors.

According to an aspect of the present inventive concept, provided is a method for processing a substrate, the method including: loading a plurality of substrates into a process chamber: supplying a pretreatment gas into the process chamber: selectively surface processing one or more substrates among the plurality of substrates using plasma generated from the pretreatment gas: supplying precursors to be adsorbed onto each of the plurality of substrates into the process chamber: supplying a reactive gas into the process chamber; and depositing a thin film on a surface of each of the plurality of substrates using plasma generated from the reactive gas and the precursors.

According to an aspect of the present inventive concept, provided is a system for processing a substrate, the system including: a process chamber including a gate for loading and unloading a plurality of substrates: a substrate support unit disposed within the process chamber, and including first stations spaced apart from the gate in a first direction, and second stations between the first stations and the gate; a gas distribution unit configured to spray a pretreatment gas and a reactive gas required for plasma generation onto the plurality of substrates: a gas supply unit configured to supply the pretreatment gas and the reactive gas; and a control unit controlling the gas supply unit and the gas distribution unit so that a first operation in which first substrates disposed on the first stations among the plurality of substrates are surface processed by the pretreatment gas, a second operation in which the first substrates and second substrates disposed on the second stations among the plurality of substrates are surface processed by the pretreatment gas, and a third operation in which a thin film is deposited on the plurality of substrates by the reactive gas, are sequentially performed.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Figure 1A:
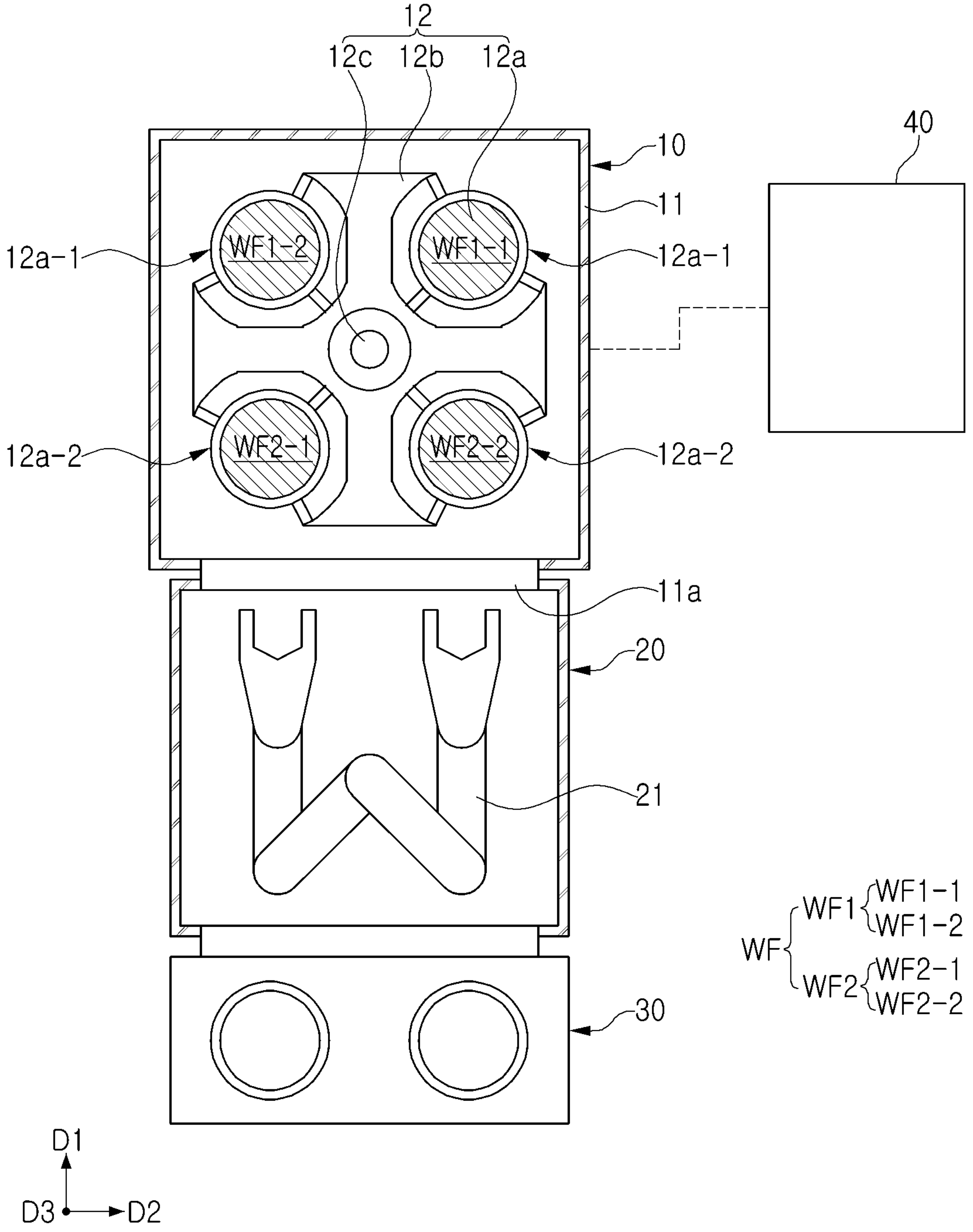
FIG. 1A is a diagram illustrating an exemplary application of a substrate processing apparatus in which a method for processing a substrate according to exemplary embodiments of the present inventive concept may be performed.

Hereinafter, with reference to the accompanying drawings, example embodiments of the present inventive concept will be described as follows. Unless otherwise specified, in this specification, terms such as 'upper portion,' 'upper surface,' 'lower portion,' 'lower surface,' 'side surface,' and the like, are based on the drawings, and may actually vary depending on a direction in which the components are arranged. Like reference characters refer to like elements throughout.

Figure 1B:
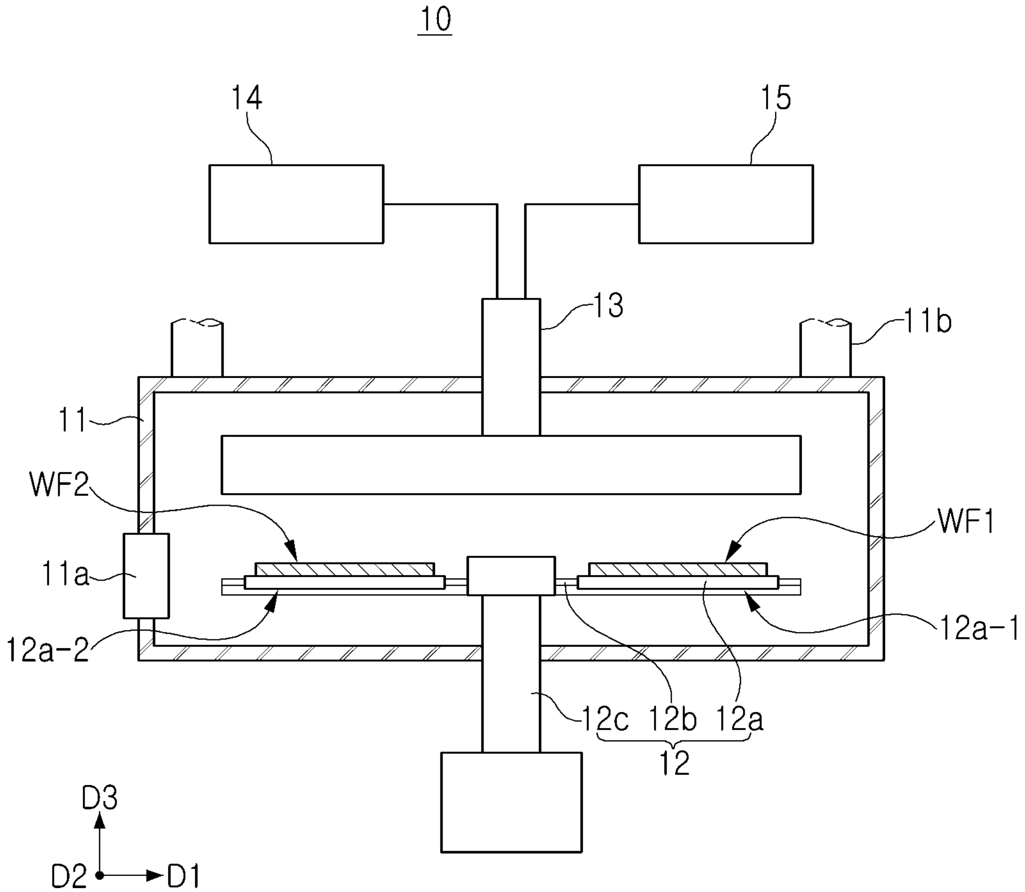
FIG. 1B is a cross-sectional view of an exemplary substrate processing apparatus.

FIG. 1A is a diagram illustrating an exemplary application example of a substrate processing apparatus 10 in which a method for processing a substrate according to exemplary embodiments of the present inventive concept may be performed, and FIG. 1B is a cross-sectional view of an exemplary substrate processing apparatus 10.

Referring to FIGS. 1A and 1B, a substrate processing apparatus 10 may include a process chamber 11, a substrate support unit 12, a gas distribution unit 13, and a gas supply unit 14. The substrate processing apparatus 10 may be a deposition apparatus performing a deposition process using plasma on substrates WF provided on the substrate support unit 12. The substrate processing apparatus 10 may be configured to deposit a thin film using a capacitively coupled plasma (CCP), an inductively coupled plasma (ICP), a remote plasma source (RPS), or the like, and a method for forming plasma is not particularly limited. The substrates WF may be, for example, silicon wafers used to manufacture semiconductor devices such as semiconductor integrated circuits (ICs). The substrates WF may include first substrates WF1 and second substrates WF2.

The process chamber 11 may provide a space in which plasma is formed and a space in which an etching process is performed. The process chamber 11 may provide a sealed internal space in which the substrates WF are processed. A gate 11*a* through which the substrate WF is loaded and unloaded may be provided on one side of the process chamber 11. An exhaust duct 11*b* may be provided on one side of the process chamber 11 to exhaust internal gases (e.g., reactive gas, purge gas, or the like) and reaction by-products. The exhaust duct 11*b* may be connected to a vacuum pump (not shown), and may be provided with a pressure control valve, a flow control valve, and the like.

The substrate support unit 12 may be disposed in a lower portion of the process chamber 11, and may support the substrates WF while processing of the substrates WF is performed. The substrate support unit 12 may include, for example, stations 12*a* on which a plurality of substrates WF are respectively placed, a table 12*b* supporting and fixing the stations 12*a*, and a rotation driving unit 12*c* configured to change positions of the stations 12*a* by rotating the table 12*b*. Although four stations 12*a* are shown in the figure, fewer or more stations 12*a* may be provided, depending on the example embodiment. For example, each of a first station 12*a*-1 and a second station 12*a*-2 may include one or three or more stations.

In an exemplary embodiment, the substrate support unit 12 may include first stations 12*a*-1 spaced apart from the gate 11*a* in a first direction D1, and second stations 12*a*-2 between the first stations 12*a*-1 and the gate 11*a*. The first stations 12*a*-1 and the second stations 12*a*-2 may be arranged in the same direction. For example, the first stations 12*a*-1 may be arranged in a line in a second direction D2, and the second stations 12*a*-2 may be arranged in a line in the second direction D2 between the first stations 12*a*-1 and the gate 11*a*.

The gas distribution unit 13 may be configured to spray gases supplied from the gas supply unit 14 to the plurality of substrates WF. The gas distribution unit 13 may include a shower head in which gas outlets are formed.

The gas supply unit 14 may supply gases required for plasma generation. The gas supply unit 14 may be configured to supply, for example, a pretreatment gas, precursors (or "source gas"), and a reactive gas. The pretreatment gas may include an inert gas. The pretreatment gas may be, for example, at least one of He, Ne, Ar, Kr, and Xe. The precursors are compounds participating in a chemical reaction to form a thin film, and may be, for example, at least one of aminosilane, silylamine, isocyanatesilane, isotonatesilane, inorganic silane, silane-containing hydroxide, and silane-containing alkoxide. The reactive gases may be at least one of oxygen ($O_2$), carbon dioxide ($CO_2$), and nitrous oxide ($N_2O$). The gas supply unit 14 may supply a purge gas for removing excess gases and reaction by-products inside the process chamber 11.

According to an exemplary embodiment, the substrate processing apparatus 10 may further include a power supply unit 15. The power supply unit 15 may supply power required for plasma generation. For example, the power supply unit 15 may apply radio frequency (RF) power in a form of electromagnetic waves having a predetermined frequency and intensity to the gas distribution unit 13, but the present inventive concept is not limited thereto.

The substrate processing apparatus 10 may be connected to a substrate transfer module 20 and a load port 30. The substrate transfer module 20 may be disposed between the load port 30 and the substrate processing apparatus 10. The substrate transfer module 20 may remove a plurality of substrates WF from the load port 30 using the robot arms 21, and insert the same into the substrate processing apparatus 10. A deposition process of the substrate processing apparatus 10 may be performed according to a substrate processing system.

The control unit 40 may include various devices for controlling components of the substrate processing apparatus 10. For example, the control unit 40 may include a storage device, a processor device, an analog and/or digital input/output device, and the like. The processor device may include, for example, a central processing unit (CPU), an application specific integrated circuit (ASIC), and the like. For example, the control unit 40 can include one or more of the following components: at least one central processing unit (CPU) configured to execute computer program instructions to perform various processes and methods, including the processes and methods disclosed herein, random access memory (RAM) and read only memory (ROM) configured to access and store data and information and computer program instructions, input/output (1/O) devices configured to provide input and/or output to the control unit 40 (e.g., keyboard, mouse, display, speakers, printers, modems, network cards, etc.), and storage media or other suitable type of memory (e.g., such as, for example, RAM, ROM, programmable read-only memory (PROM), erasable programmable read-only memory (EPROM), electrically erasable programmable read-only memory (EEPROM), magnetic disks, optical disks, floppy disks, hard disks, removable cartridges, flash drives, any type of tangible and non-transitory storage medium) where data and/or instructions can be stored. In addition, the control unit 40 can include antennas, network interfaces that provide wireless and/or wire line digital and/or analog interface to one or more networks over one or more network connections (not shown), a power source that provides an appropriate alternating current (AC) or direct current (DC) to power one or more components of the controller, and a bus that allows communication among the various disclosed components of the control unit 40.

In the substrate processing system according to an example embodiment, the control unit 40 may control the gas supply unit 14 and the gas distribution unit 13 so that a first operation in which first substrates WF1 disposed on first stations 12*a*-1 are surface processed by a pretreatment gas (see FIGS. 9 and 10A), a second operation in which second substrates WF2 disposed on second stations 12*a*-2 are surface processed (see FIGS. 9 and 10B), and a third operation in which a thin film is deposited on the plurality of substrates WF by a reactive gas are sequentially performed. As shown in FIG. 1A, the first substrates WF1 may include first substrates WF1-1 and WF1-2, and the second substrates WF2 may include second substrates WF2-1 and WF2-2.

When a plurality of substrates WF are sequentially loaded into the above-described substrate processing apparatus 10 at intervals, some substrates (e.g., first substrates WF1) remaining in the process chamber 11 for a long time are exposed to heat for a longer period of time than other substrates (e.g., second substrates WF2), which may increase consumption of some substrates (e.g., first substrates WF1) in a thin film deposition process. For example, first, the first substrates WF1 may be simultaneously loaded on the first stations 12*a*-1 in a state in which the first stations 12*a*-1 are adjacent to the gate 11*a*, and then the second substrates WF2 may be simultaneously loaded on the second stations 12*a*-2 of which positions thereof are changed by rotation of the table 12*b*. In this case, consumption of a substrate (e.g., hard mask) generated during the thin film deposition process may be greater on the first substrates WF1 than on the second substrates WF2. In addition, a difference in consumption may cause a difference in critical dimensions (CD) of final pattern structures between the first substrates WF1 and the second substrates WF2 after subsequent processes such as an etching process, a cleaning process, and the like, are completed.

Hereinafter, with reference to FIGS. 2A to 2F and FIG. 3, a difference in consumption of a substrate generated in a method for processing a substrate of Comparative Example in which surface processing (operation S120) of the substrate is omitted in the flowchart illustrated in FIG. 4 will be described.

Figure 2A:
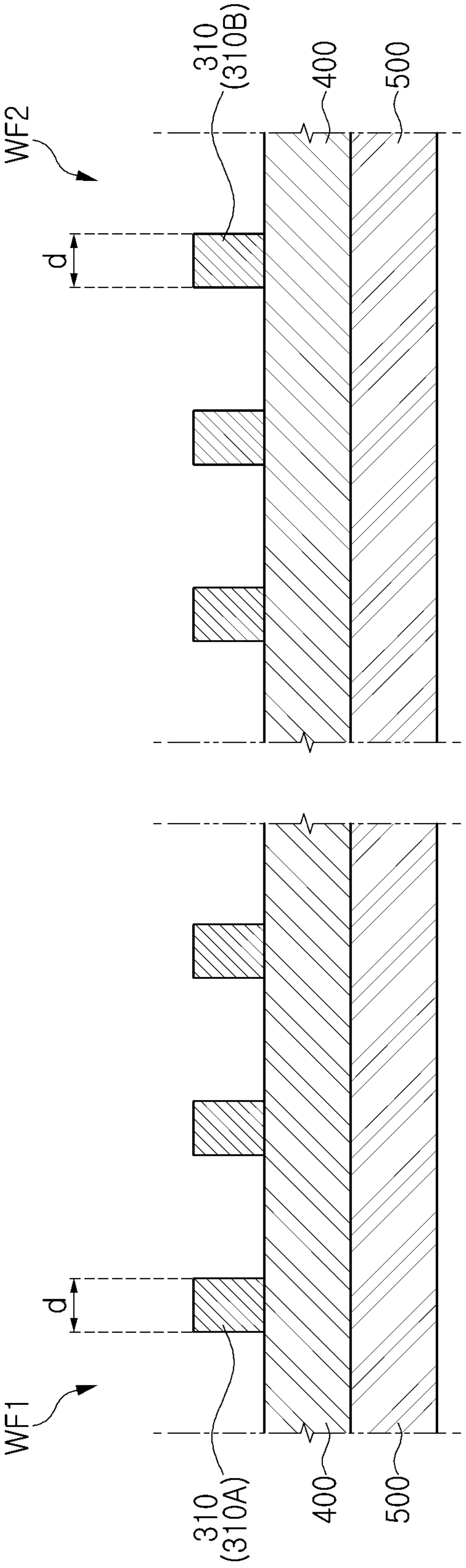
FIGS. 2A to 2F are drawings illustrating a difference in critical dimensions (CD) of final pattern structures between a plurality of substrates when a method for processing a substrate of a Comparative Example is applied.
Figure 2B:
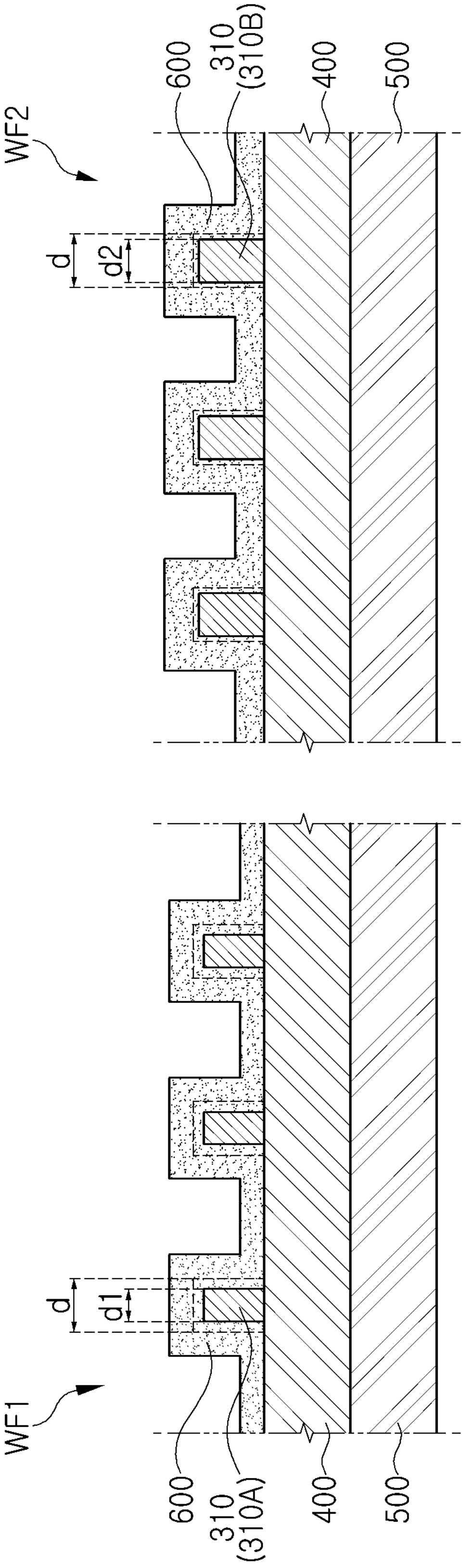

FIGS. 2A to 2F are diagrams illustrating a difference in critical dimensions (CD) of final pattern structures between a plurality of substrates when substrate processing method of a comparative example is applied. FIGS. 2A and 2B are views for illustrating a deposition process performed on the first substrates WF1 and the second substrates WF2 by the substrate processing apparatus 10 described above. FIGS. 2C to 2F are views for illustrating subsequent processes performed on the first and second substrates WF1 and WF2 after a deposition process is completed.

Figure 3:
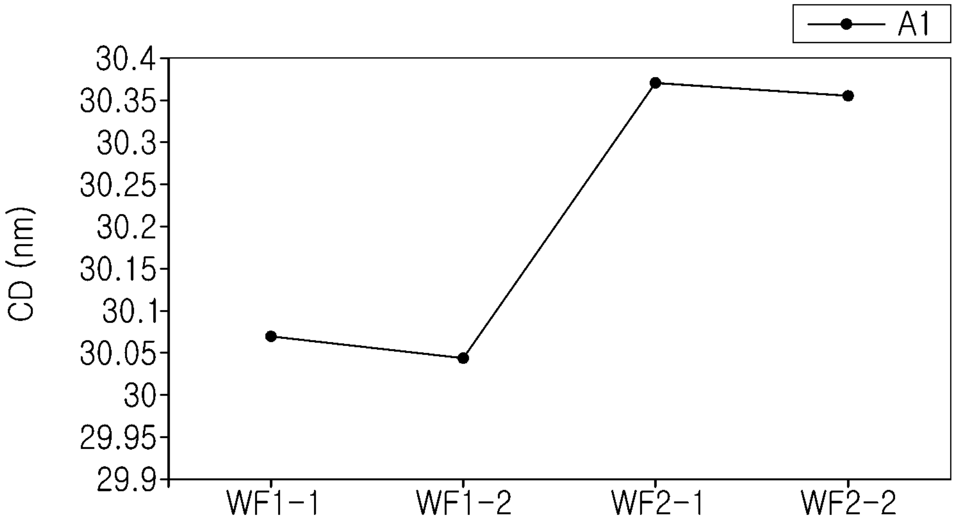
FIG. 3 is a graph illustrating a difference in critical dimensions of final pattern structures among a plurality of substrates after performing the method for processing a substrate of the Comparative Example.

FIG. 3 is a graph illustrating a difference in critical dimensions (CD) of final pattern structures among a plurality of substrates after performing a substrate processing method of Comparative Example. 'A1' is a graph illustrating a distribution of the critical dimension (CD).

Referring to FIG. 2A, each of the first substrates WF1 and the second substrates WF2 may include a semiconductor layer 500, a conductive layer 400, and mask patterns 310 (also referred to as "previous mask patterns").

The semiconductor layer 500 may include a semiconductor substrate, for example, a group IV semiconductor substrate, a group III-V compound semiconductor substrate, or a group II-VI oxide semiconductor substrate. For example, the group IV semiconductor substrate may include a silicon substrate, a germanium substrate, or a silicon-germanium substrate. The semiconductor layer 500 may include a bulk wafer or an epitaxial layer. Although not shown in the drawings, a plurality of active regions, device isolation layers, silicon oxide layers, and the like may be formed on the semiconductor layer 500.

The conductive layer 400 is a layer on which conductive lines or pads are formed, and may be formed of polysilicon, doped polysilicon, metal, a metal nitride, or a combination thereof. The conductive layer 400 may form final pattern structures through a subsequent process.

The mask patterns 310 may have a single-layer or multilayer structure. The mask patterns 310 are patterned hard mask layers. For example, in the case of a multilayer structure, the mask patterns 310 may have a structure in which two or more hard mask layers having different etching characteristics under predetermined etching conditions are stacked. The mask patterns 310 may be, for example, hard mask layers formed of a hydrocarbon compound having a high carbon content (e.g., about 85 to 99% by weight based on the total weight) or a derivative thereof. The mask patterns 310 may be formed by patterning a hard mask layer formed on the conductive layer 400 through a spin coating process or another deposition process. The hard mask layer may be patterned into mask patterns 310 having predetermined widths d and intervals using an exposure process, an etching process, or the like. The mask patterns 310 may include first mask pattern 310A and second mask patterns 310B. The first mask patterns 310A of the first substrates WF1 and the second mask patterns 310B of the second substrates WF2 may be formed to have substantially the same width d.

The mask patterns 310 may include an antireflective layer (not shown) and a partial spacer (not shown) stacked thereon. The antireflective layer (not shown) (Antireflective Coating, ARC) may include, for example, SiON. The partial spacer (not shown) may be, for example, a patterned photo resist (PR).

Referring to FIG. 2B, a thin film 600 may be formed on the first substrates WF1 and the second substrates WF2. The thin film 600 may be formed using the substrate processing apparatus 10 described above. The thin film 600 may include a material having etching selectivity different from that of the mask patterns 310. The thin film 600 may be an atomic layer deposition (ALD) layer formed using a precursor (e.g., DIPAS) and plasma (e.g., $O_2$ plasma) generated from a reactive gas. The plasma generated from the reactive gas may cause a decomposition reaction with carbon-based mask patterns 310 to consume the mask patterns 310. As a result, a width d of the mask patterns 310 may be reduced. As described above, a consumption amount of the first substrates WF1 preloaded into the process chamber 11 may be greater than a consumption amount of the second substrates WF2. Therefore, in the process of depositing the thin film 600, the first mask patterns 310A may be consumed with a first width d1, and the second mask patterns 310B may be consumed with a second width d2, greater than the first width d1. For example, widths of the first mask patterns 310A may be reduced from the width d to the first width d1, and widths of the second mask patterns 310B may be reduced from the width d to the second width d2. When the thin film 600 is formed to a target thickness by performing n cycles of the deposition process, the first substrates WF1 and the second substrates WF2 may be unloaded from the process chamber 11 and used in a subsequent process.

Figure 2C:
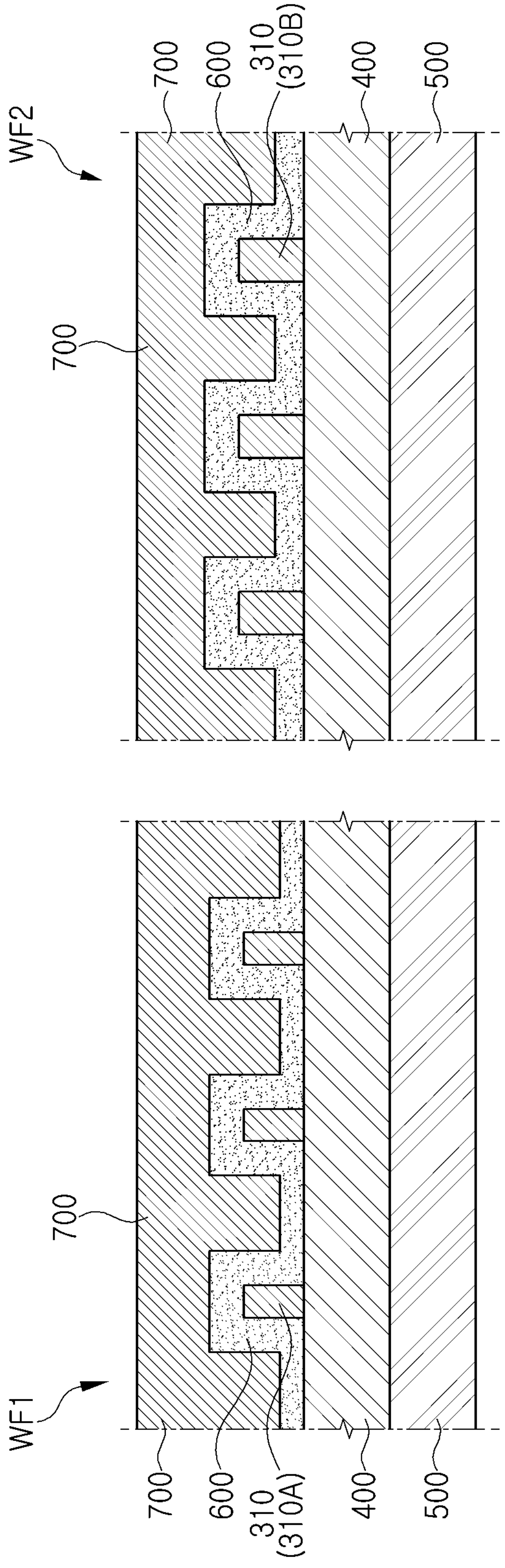

Referring to FIG. 2C, a preliminary mask pattern layer 700 may be formed on the mask patterns 310. The preliminary mask pattern layer 700 may be a hard mask layer formed through a spin coating process or another deposition process. The preliminary mask pattern layer 700 may be formed of, for example, a hydrocarbon compound having a high carbon content (e.g., about 85 to 99% by weight based on the total weight). or a derivative thereof. The preliminary mask pattern layer 700 may fill spaces between the mask patterns 310.

Figure 2D:
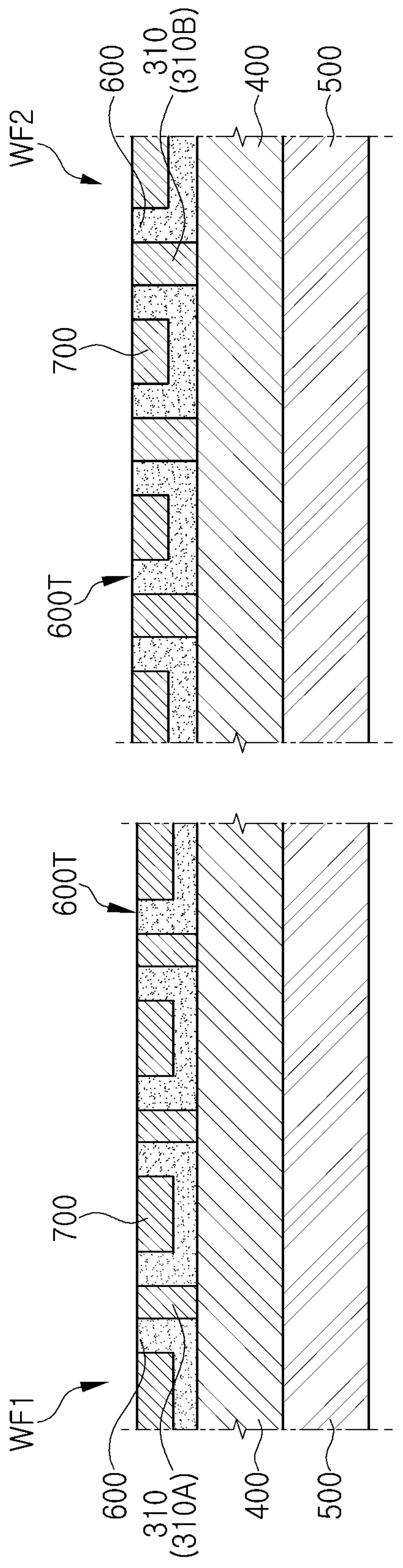

Referring to FIG. 2D, after performing subsequent processes, portions of each of the preliminary mask pattern layer 700 and the thin film 600 may be removed to expose the mask patterns 310. The portions of the preliminary mask pattern layer 700 and the thin film 600 may be removed using a dry or wet etching process, a stripping process, an ashing process, or the like. Upper ends 600T of the thin film 600 surrounding the mask patterns 310 may be exposed from the preliminary mask pattern layer 700.

Figure 2E:
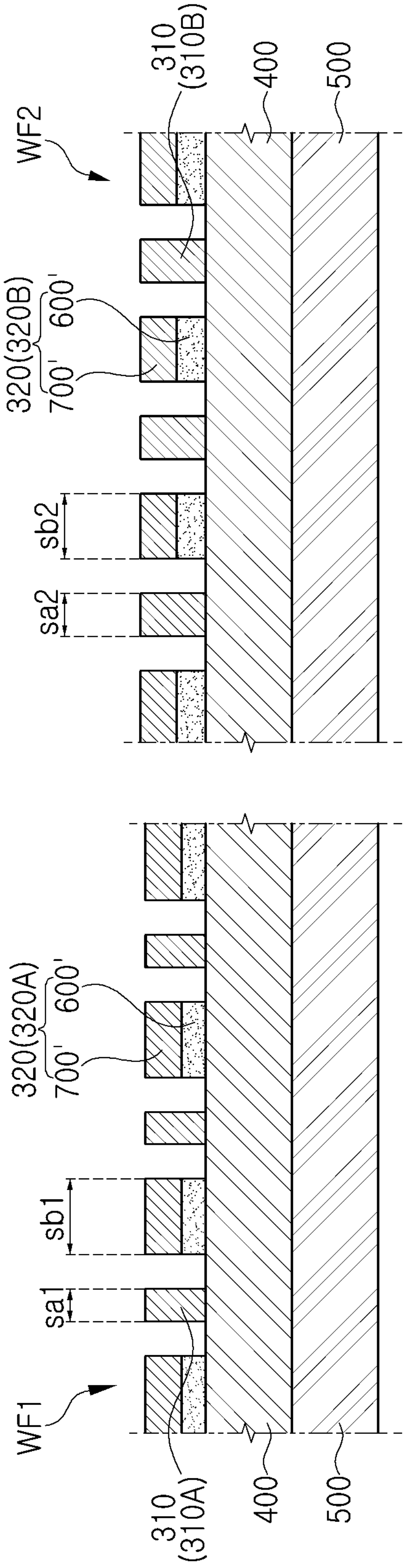

Referring to FIG. 2E, subsequent mask patterns 320 may be formed between preceding mask patterns 310. The subsequent mask patterns 320 may include the first subsequent mask patterns 320A of the first wafers WF1 and the second subsequent mask patterns 320B of the second wafers WF2. The subsequent mask patterns 320 may be formed by removing a portion of the thin film 600 filling a gap between the preceding mask patterns 310 and the preliminary mask pattern layer 700. A portion of the thin film 600 may be removed using an anisotropic reactive ion etching (RIE) process. The mask patterns 310 may not be etched according to etching selectivity. The subsequent mask patterns 320 may include a remaining portion 700' of the preliminary mask pattern layer 700 and a remaining portion 600' of the thin film 600. The subsequent mask patterns 320 of the first and second wafers WF1 and WF2 may be patterned to have subsequent widths sb1 and sb2, respectively. Due to consumption of the mask patterns 310 described with reference to FIG. 2B, the preceding widths sa1 and sa2 of the previous mask patterns 310 of the first and second wafers WF1 and WF2, respectively, may be smaller than the subsequent widths sb1 and sb2 of the first and second subsequent mask patterns 320A and 320B of the first and second wafers WF1 and WF2, respectively. In addition, due to a difference in consumption between the first substrates WF1 and the second substrates WF2, a first preceding width sa1 of the first mask patterns 310A may be smaller than a second preceding width sa2 of the second mask patterns 310B. A first subsequent width sb1 of the first mask patterns 310A may be greater than a second subsequent width sb2 of the second mask patterns 310B.

Figure 2F:
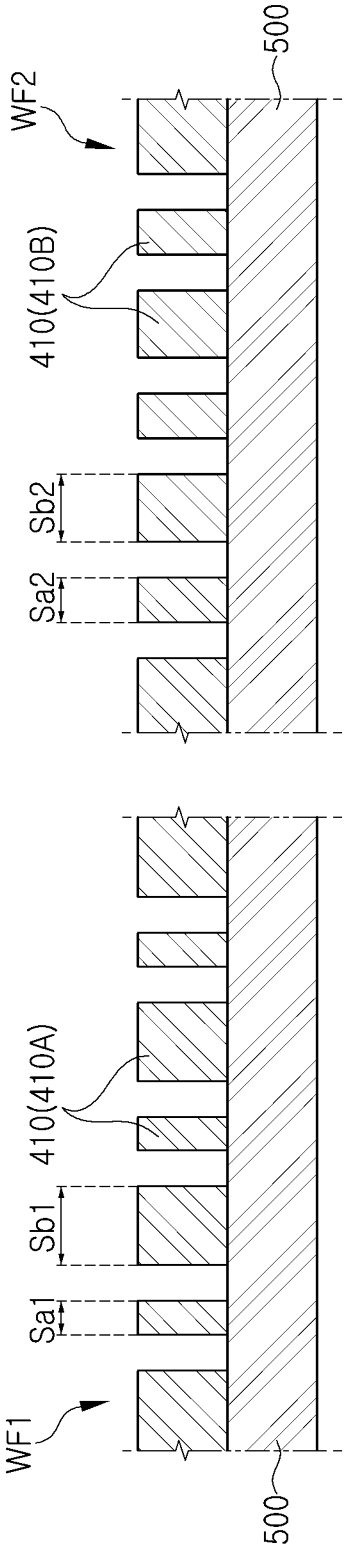

Referring to FIG. 2F, final pattern structures 410 obtained by transferring the preceding mask patterns 310 and the subsequent mask patterns 320 may be formed. The final pattern structures 410 may be formed by patterning a conductive layer 400 by performing an etching process using the preceding mask patterns 310 and the subsequent mask patterns 320 as etching masks. The final pattern structures 410 may have preceding line widths Sa1 and Sa2 corresponding to the preceding widths sa1 and sa2 of the preceding mask patterns 310 and subsequent line widths Sb1 and Sb2 corresponding to the subsequent widths sb1 and sb2 of the subsequent mask patterns 320. The first final pattern structures 410A may have a first preceding line width Sa1 and a first subsequent line width Sb1, and the second final pattern structures 410B may have a second preceding line width Sa2 and a second subsequent line width Sb2. The difference in consumption between the first substrates WF1 and the second substrates WF2 described with reference to FIG. 2B may be a cause of a difference in critical dimensions CD or median critical dimensions MCD between the first final pattern structures 410A and the second final pattern structures 410B. For example, the first preceding line width Sa1 of the first final pattern structures 410A may be narrower than the second preceding line width Sa2 of the second final pattern structures 410B. The first subsequent line width Sb1 of the first final pattern structures 410A may be greater than the second subsequent line width Sb2 of the second final pattern structures 410B. A difference between the preceding line widths Sa1 and Sa2 to which the preceding mask patterns 310 are transferred may have a greater effect on the critical dimension CD than the difference between the subsequent line widths Sb1 and Sb2. For example, the increased amount of consumption of the mask patterns 310 may reduce the critical dimension (CD) of the final pattern structure 410.

Referring to FIG. 3, in the substrates WF1-1 and WF1-2 to which the method for processing a substrate of Comparative Example is applied, the distribution of the critical dimension CD of final pattern structures may be known. The 1-1 substrate WF1-1 and the 1-2 substrate WF1-2 remaining in the process chamber for a relatively long time have a critical dimension CD of about 30.1 nm or less, whereas the 2-1 substrate WF2-1 and the 2-2 substrate WF2-2 may have a critical dimension CD of about 30.3 nm or more. The critical dimension CD of FIG. 3 is a result of measuring the median critical dimension MCD.

In a method for processing a substrate according to exemplary embodiments of the present inventive concept, by relatively greatly suppressing consumption of a base (e.g., a hard mask) in the first substrates WF1 first loaded into the substrate processing apparatus 10, a consumption amount of the hard mask between the first substrates WF1 and the second substrates WF2 may be controlled to substantially the same level. As a result thereof, a difference in critical dimensions CD of final pattern structures between the first substrates WF1 and the second substrates WF2, e.g., a difference in median critical dimensions MCD may be minimized. A specific substrate processing method will be described later with reference to FIG. 4.

Figure 4:
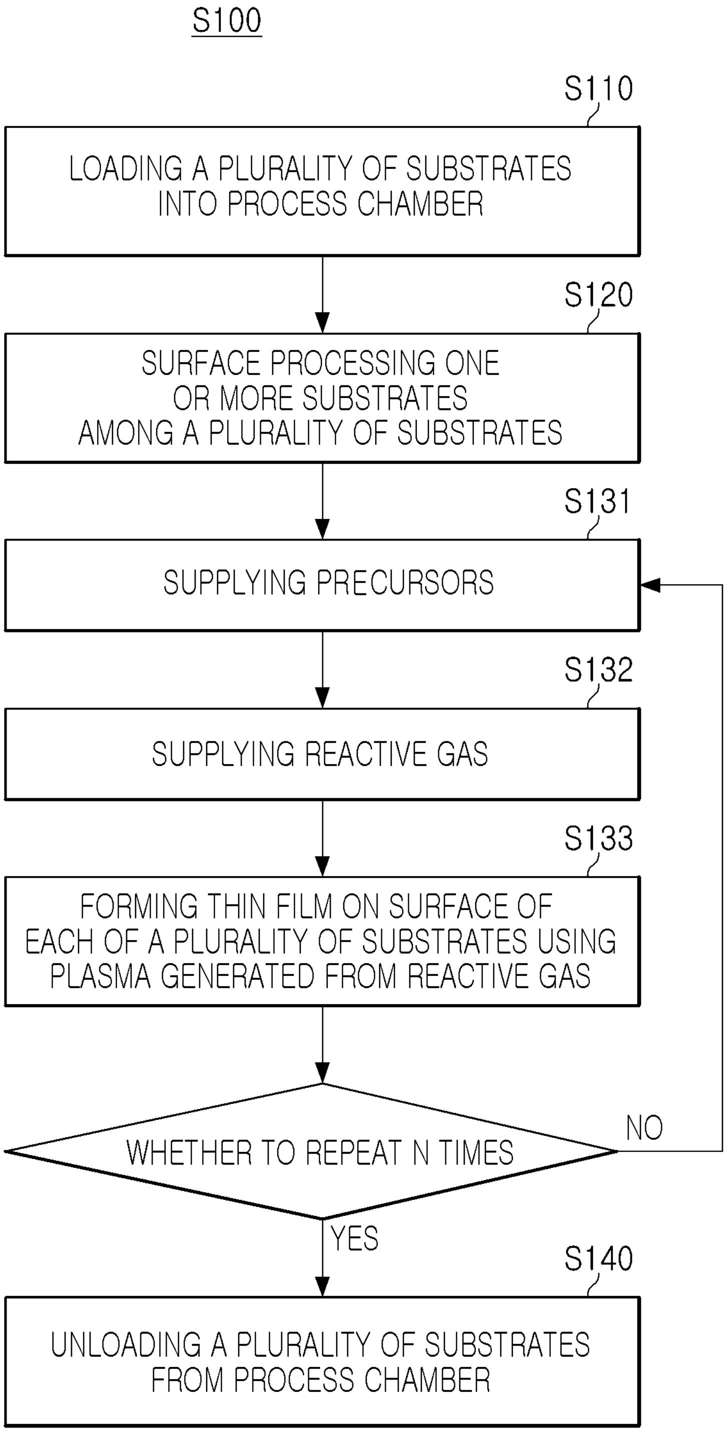
FIG. 4 is a flowchart illustrating a method for processing a substrate according to an example embodiment of the present inventive concept.

FIG. 4 is a flowchart illustrating a method for processing a substrate (S100) according to an example embodiment of the present inventive concept. Hereinafter, the method for processing a substrate (S100) of an example embodiment will be described with reference to the substrate processing apparatus 10 of FIGS. 1A and 1B together.

Figure 5A:
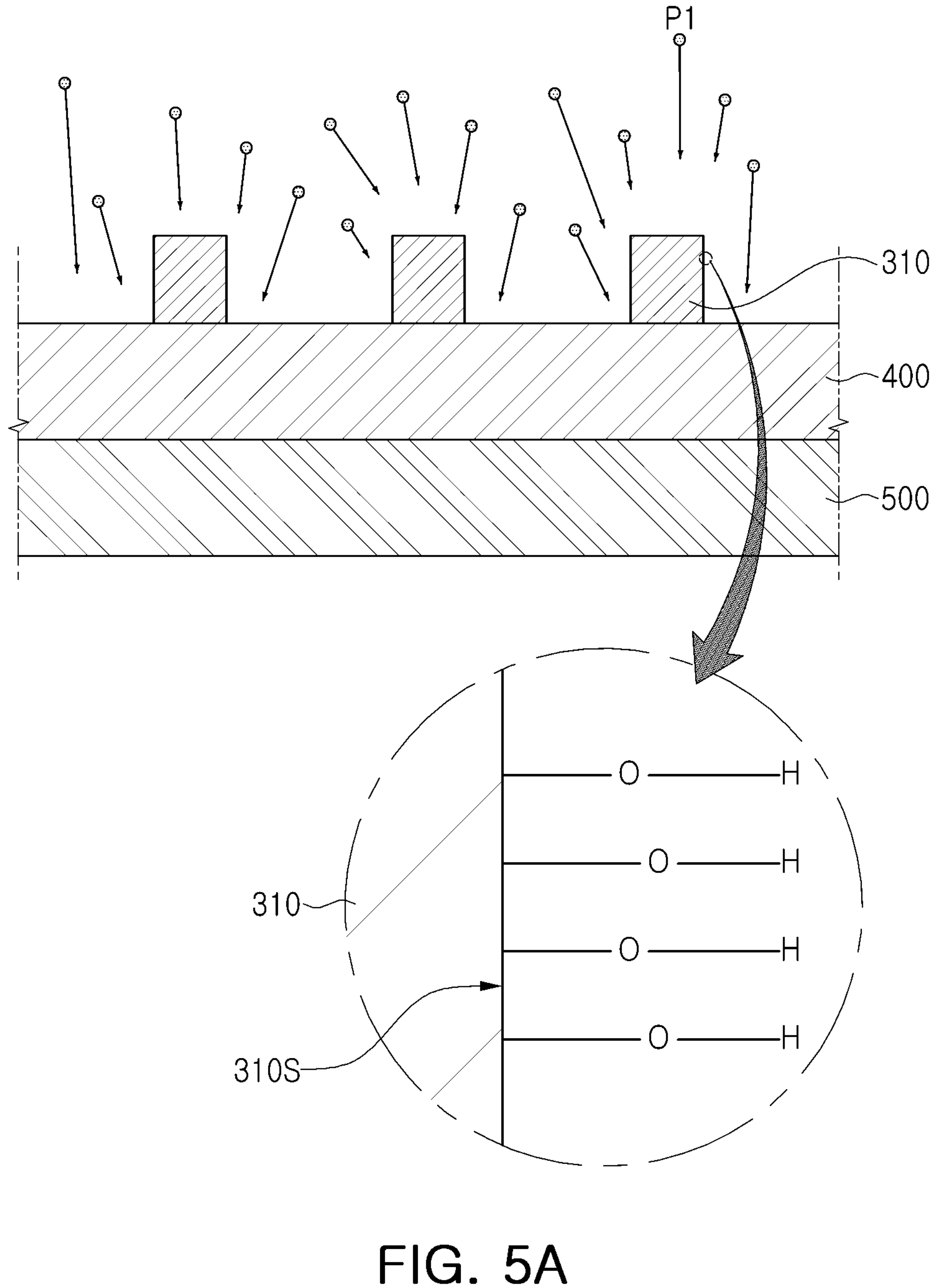
FIGS. 5A and 5B are cross-sectional views for illustrating an effect of reducing consumption of mask patterns by a method for processing a substrate according to an example embodiment of the present inventive concept.
Figure 5B:
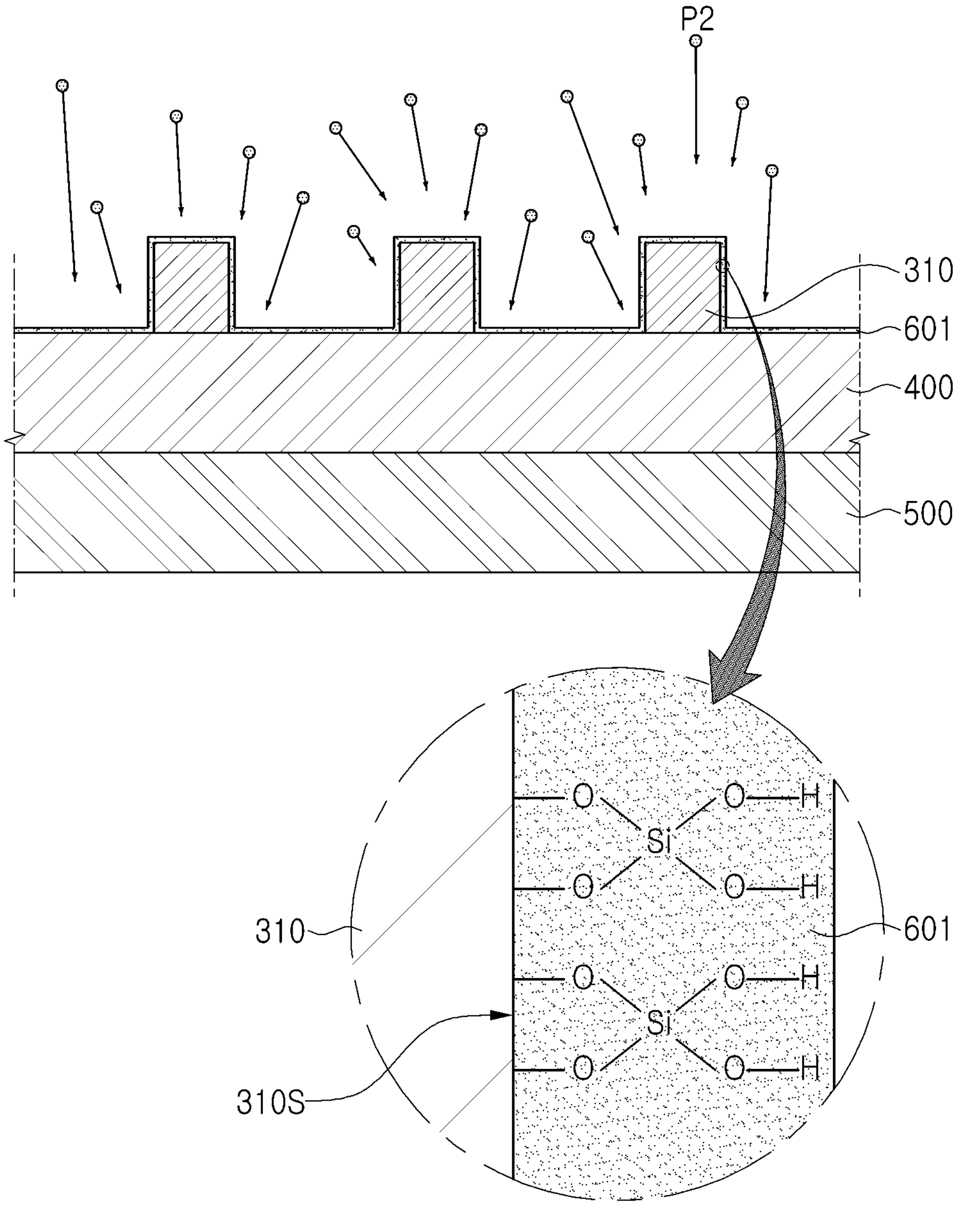

FIGS. 5A and 5B are cross-sectional views illustrating an effect of reducing consumption of mask patterns by the method for processing a substrate according to an example embodiment of the present inventive concept.

Referring to FIGS. 4, 5A, and 5B, the method for processing a substrate (S100) may include: loading a plurality of substrates WF into a process chamber 11 (S110); selectively surface processing one or more substrates among the plurality of substrates (S120): supplying precursors (S131): supplying a reactive gas (S132); depositing a thin film on a surface of each of the plurality of substrates WF (S133); and unloading a plurality of substrates WF (S140). The method for processing a substrate (S100) may further include supplying a purge gas for removing excess gas, reaction by-products, and the like in the process chamber 11 before and after each operation.

Specifically, a plurality of first substrates WF1 and a plurality of second substrates WF2 on which the mask patterns 310 are formed may be loaded into the process chamber 11 (S110). The plurality of first substrates WF1 and the plurality of second substrates WF2 may be sequentially loaded thereinto by a substrate transfer module 20. The plurality of first substrates WF1 may be loaded into the process chamber 11 before the plurality of second substrates WF2.

The plurality of first substrates WF1 may be surface processed by plasma generated from the pretreatment gas (S120). As shown in FIG. 5A, a large amount of hydroxyl groups may be generated on a surface 310S of each of the mask patterns 310 by plasma P1 generated from the pretreatment gas. According to example embodiments of the present inventive concept, by selectively surface-processing one or more substrates (e.g., the first substrates WF1) loaded into first among the plurality of substrates WF loaded into the process chamber 11, an amount of adsorption of precursor may be increased, and as a result thereof, an amount of deposition of the thin film may be increased, and a consumption amount of the mask patterns 310 may be reduced. The plurality of first substrates WF1 may be surface processed by supplying a pretreatment gas into the process chamber 11 and surface processing using plasma (e.g., Ar plasma) generated from the pretreatment gas. The pretreatment gas may be, for example, an inert gas such as He, Ne, Ar, Kr, or Xe. In order to control the consumption amount of the plurality of first substrates WF1 and the plurality of second substrates WF2 to a similar level, all of the plurality of first substrates WF1 and the plurality of second substrates WF2 may be additionally surface processed, but the present inventive concept is not limited thereto. This will be described in more detail with reference to FIG. 9. Although the surface 310S is illustrated as a single side surface of the mask patterns 310, the surface 310S may be any exposed surface of the mask patterns 310.

Precursors for depositing a thin film may be supplied into the process chamber 11 (S131). The precursors may be chemisorbed on a surface of each of the plurality of first substrates WF1 and the plurality of second substrates WF2. The precursors may react with hydroxyl groups on the surface 310S of the mask patterns 310. An increase in hydroxyl groups by the above-described surface processing may increase an adsorption rate of the precursors. This will be described in more detail with reference to FIGS. 7A and 7B. The precursors may include at least one of source materials for forming a silicon oxide layer, for example, aminosilane, silylamine, isocyanatesilane, isotonatesilane, inorganic silane, silane-containing hydroxide, and silane-containing alkoxide. The precursors may be Di-isopropylamino Silane (DIPAS). The precursors may be supplied in a gaseous state. Excess precursors may be removed by a purge gas.

A reactive gas may be supplied into the process chamber 11 (S132). The reactive gas may be at least one of oxygen ($O_2$), carbon dioxide ($CO_2$), and nitrous oxide ($N_2O$). The reactive gas may chemically react with the precursors adsorbed on surfaces of substrates WF to form a thin film on a surface of each of the plurality of first substrates WF1 and the plurality of second substrates WF2 (S133). To activate the reactive gas, plasma may be generated from the reactive gas. As shown in FIG. 5B, plasma P2 generated from the reactive gas may react with an atomic layer (e.g., silicon (Si)) of the precursors adsorbed on a surface 310S of each of the mask patterns 310, to form a single thin film layer 601 (e.g., $SiO_2$) extending along the surface 310S of the mask patterns 310. An increase in the adsorption rate of the precursors described above may increase a substation rate of the precursors by the reactive gas, and reduce the consumption amount of the mask patterns 310 by the reactive gas (or plasma). This will be described in more detail with reference to FIGS. 6A and 6B.

A thin film 600 having a target thickness may be formed by performing a single cycle performed by operations S131, S132, and S133 n times. Thereafter, the plurality of first substrates WF1 and the plurality of second substrates WF2 may be unloaded from the process chamber 11 by the substrate transfer module 20.

Figure 6A:
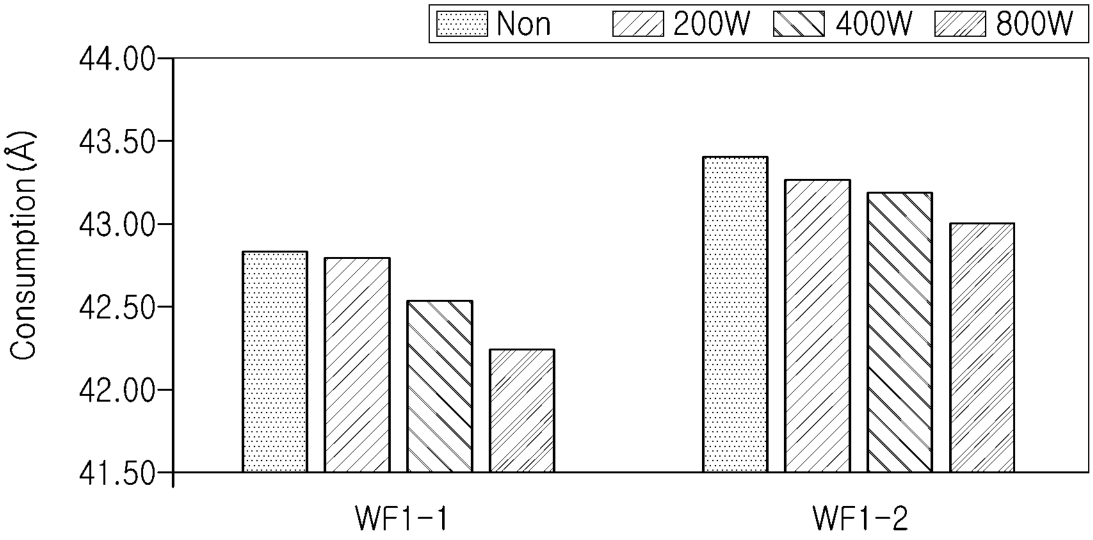
FIGS. 6A and 6B are graphs illustrating an effect of reducing consumption of mask patterns according to conditions of a pretreatment process.
Figure 6B:
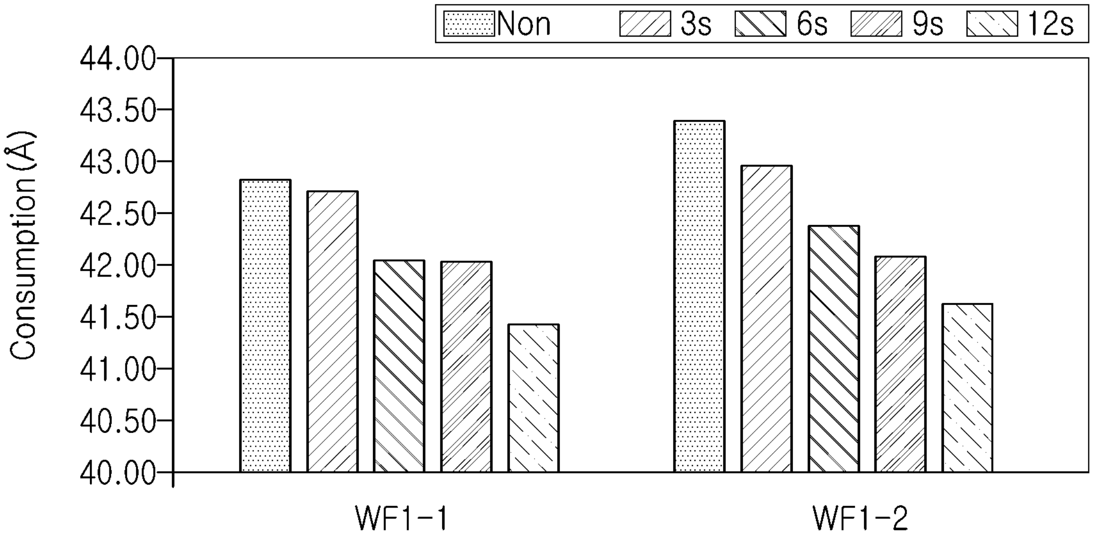

FIGS. 6A and 6B are graphs illustrating an effect of reducing consumption of mask patterns 310 according to conditions of a pretreatment process. FIG. 6A illustrates a consumption amount of first substrates WF1 according to a change in plasma power in surface processing. FIG. 6B illustrates a consumption amount of first substrates WF1 according to a change in exposure time in surface processing. Here, the "the consumption amount" may be defined by measuring a change in thickness of the mask patterns 310 before and after a thin film 600 is formed.

Referring to FIG. 6A, it can be seen that a consumption amount of a 1-1 substrate WF1-1 and a 1-2 substrate WF1-2 decreases as plasma power 200 W, 400 W, and 800 W of the surface processing, that is, power supplied to generate plasma from the pretreatment gas increases, as compared to the case in which the surface processing is not performed (Non). For example, plasma power is supplied at 200 W, 400 W, and 800 W, and as a result of measuring the consumption amount of each of the 1-1 substrate WF1-1 and the 1-2 substrate WF1-2, as the plasma power increases, the consumption amount decreases, and the lowest the consumption amount was measured at 800 W.

Referring to FIG. 6B, it can be seen that a consumption amount of a 1-1 substrate WF1-1 and a 1-2 substrate WF1-2 is reduced as exposure times 3 s, 6 s, 9 s, and 12 s in the surface processing increase, that is, a time exposed to the pretreatment gas increases, as compared to the case in which the surface processing is not performed (Non). For example, the exposure time of the surface processing was increased to 3 seconds (3 s), 6 seconds (6 s), 9 seconds (9 s), and 12 seconds (12 s), and as a result of measuring the consumption amount of each of the 1-1 substrate WF1-1 and the 1-2 substrate WF1-2, the consumption amount was reduced as the exposure time increased, and the lowest consumption was measured at 12 seconds (12 s).

Figure 7A:
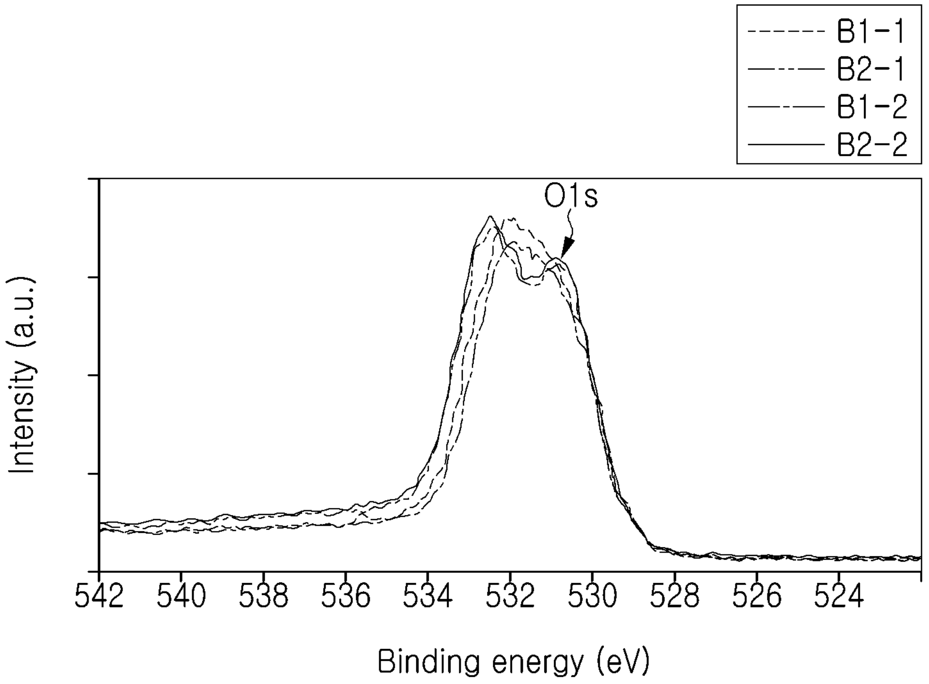
FIGS. 7A and 7B are graphs illustrating a change in properties of a substrate according to surface processing of the substrate.
Figure 7B:
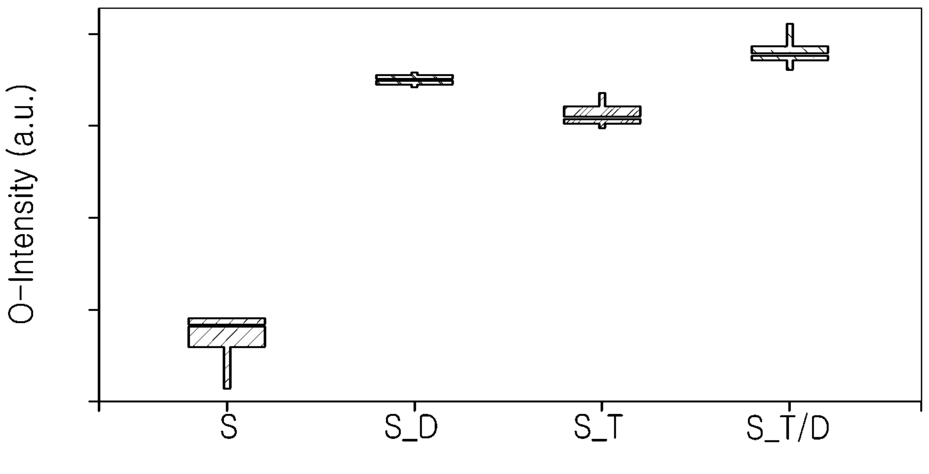

FIGS. 7A and 7B are graphs illustrating a change in properties of a substrate according to surface processing of the substrate. FIG. 7A is an XPS analysis result for illustrating a change in surface components of a substrate by surface processing. FIG. 7B is a TOF-SIMS analysis result (oxygen ion intensity) for illustrating a change in surface components of a substrate for each operation of the process.

Referring to FIG. 7A, 'B1-1' is a graph obtained by surface analysis of a center of a substrate before surface processing, and 'B1-2' is a graph obtained by surface analysis of an edge of the substrate before surface processing. 'B2-1' is a graph of surface analysis of the center of the substrate after surface processing using argon plasma, and 'B2-2' is a graph of surface analysis of the edge of the substrate after surface processing using argon plasma. After a surface processing using argon plasma, it can be seen that an oxygen (O1 s, about 531 eV) peak, that is, a binding energy peak of hydroxyl groups (—OH) is increased at both the center and the edge of the substrate.

Referring to FIG. 7B, 'S' represents a distribution amount of oxygen components on a surface of the substrate before surface processing, that is, on a surface of a carbon-based hard mask. 'S_D' represents a distribution amount of oxygen components on a surface of a substrate on which one cycle of silicon oxide film deposition process has been performed without surface processing. 'S_T' represents a distribution amount of oxygen components on a surface of a substrate after surface processing (100 seconds) using argon plasma. 'S_T/D' represents a distribution amount of oxygen components on a surface of a substrate after one cycle of surface processing (100 seconds) and silicon oxide deposition process.

When a silicon oxide film is deposited on the surface of the hard mask (S_D), it can be seen that the oxygen component on the surface of the substrate is rapidly increased. Similarly, in the case of surface processing using argon plasma (S_T), it can be seen that the oxygen component of the surface of the substrate is rapidly increased. In addition, when both the surface processing and the deposition process are applied (S_T/D), it can be seen that the oxygen component on the substrate surface is detected the most. That is, when the surface processing is applied, the oxygen component, that is, a distribution of oxygen components, that is, the hydroxyl group (—OH) described with reference to FIG. 7A, on a surface of a hard mask is increased, which can reduce consumption of the hard mask and increase a substitution rate of the precursor in a process of depositing the silicon oxide film.

Figure 8A:
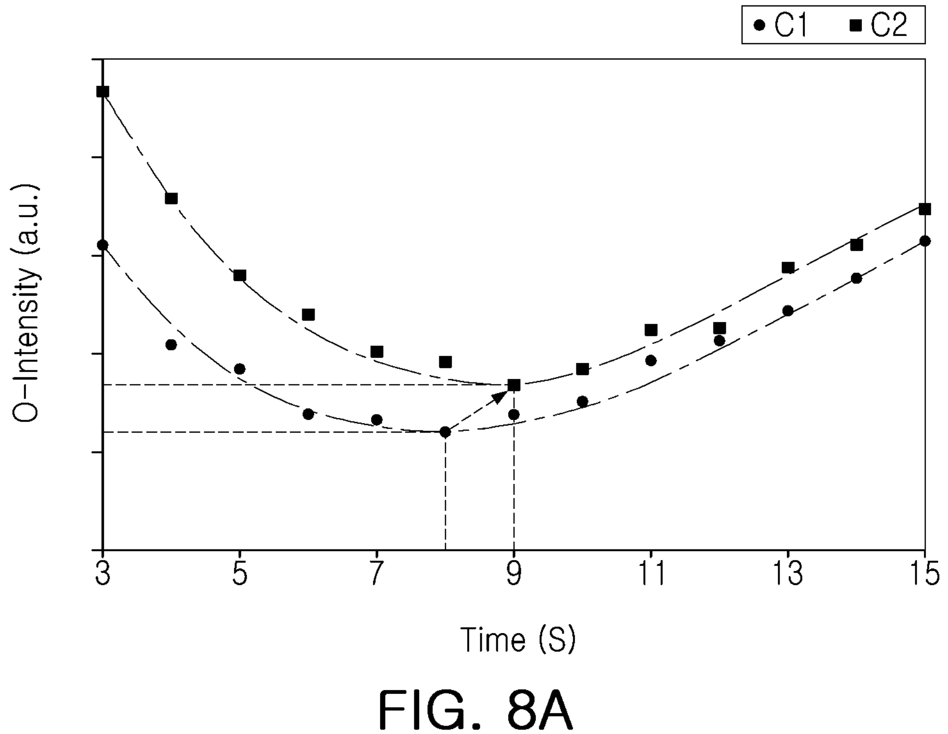
FIGS. 8A and 8B are graphs illustrating a change in properties of a thin film according to surface processing of the substrate.
Figure 8B:
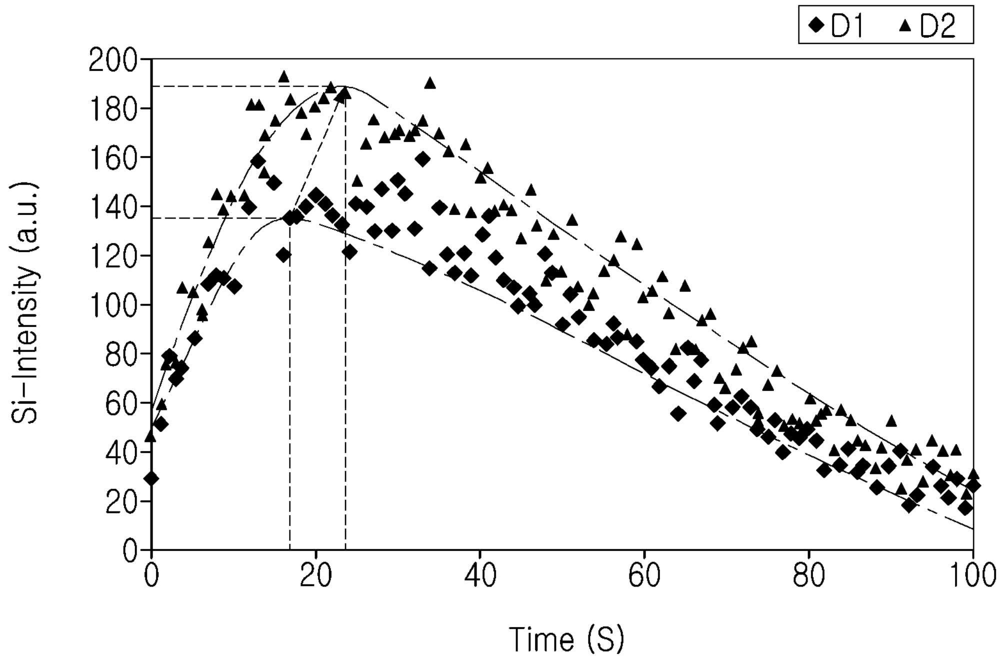

FIGS. 8A and 8B are graphs illustrating a change in properties of a thin film according to the surface processing of a substrate. FIG. 8A is a TOF-SIMS analysis result (oxygen ion intensity) for illustrating a change in components according to a depth direction of a thin film. FIG. 8B is a TOF-SIMS analysis result (silicon ion intensity) for illustrating a change in components according to a depth direction of a thin film.

Referring to FIG. 8A, 'C1' represents a distribution of oxygen components according to a depth of a substrate on which one cycle of silicon oxide film deposition process has been performed without surface processing. 'C2' represents a distribution of oxygen components according to a depth of a substrate on which one cycle of surface processing and silicon oxide film deposition process were performed. In the case of surface processing before the oxide film deposition process (C2), it can be seen that overall oxygen intensity is increased, and depth and intensity of the lowest intensity point (inflection points of C1 and C2) are increased.

Referring to FIG. 8B, D1 represents a distribution of silicon components according to a depth of a substrate on which one cycle of silicon oxide film deposition process has been performed without surface processing. D2 represents a distribution of silicon components according to the depth of the substrate on which one cycle of surface processing and silicon oxide deposition process have been performed. In the case of surface processing before the oxide film deposition process (D2), it can be seen that overall silicon intensity is increased, and depth and intensity of the points with the highest intensity (inflection points of D1 and D2) are increased, at a point having highest intensity (inflection points of D1 and D2) are increased. That is, summarizing the analysis results of FIGS. 8A and 8B, it can be seen that the thickness of the thin film formed at the beginning of the deposition process (1 cycle) is increased by the surface processing of the substrate.

Figure 9:
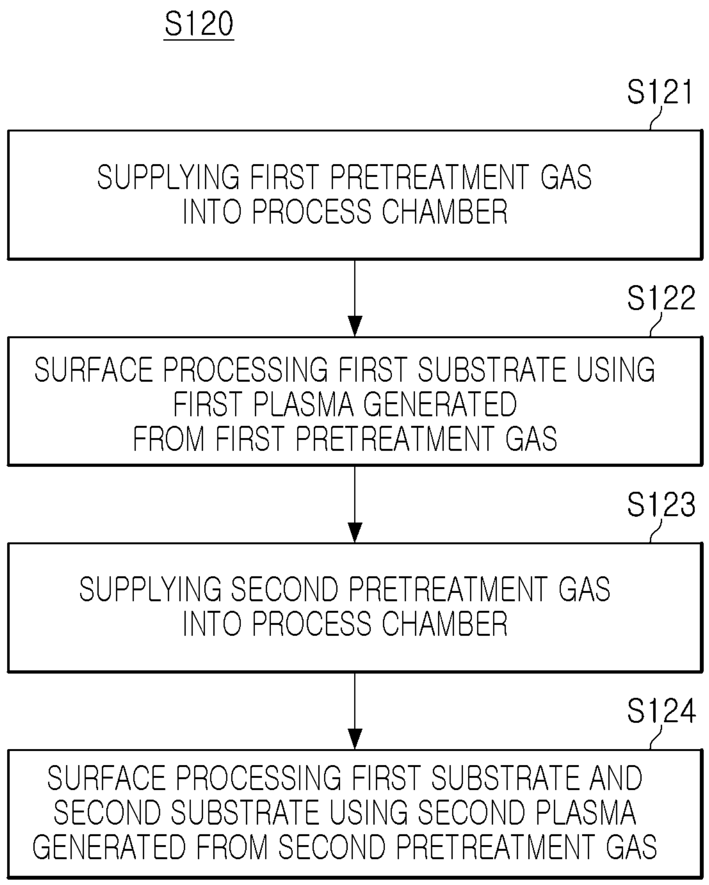
FIG. 9 is a flowchart illustrating a method for processing a substrate according to an example embodiment of the present inventive concept.

FIG. 9 is a flowchart illustrating a method for processing a substrate according to an example embodiment of the present inventive concept. FIG. 9 is a flowchart illustrating a surface processing operation S120 of FIG. 4 of the substrate WF according to an exemplary embodiment.

Figure 10A:
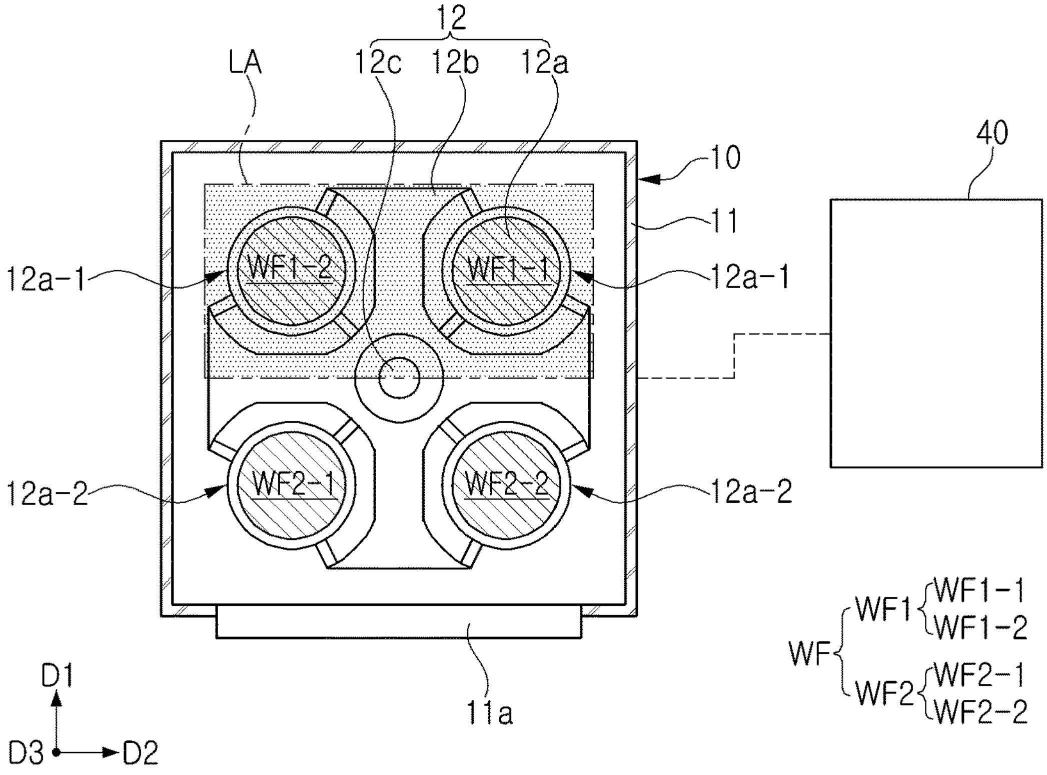
FIGS. 10A and 10B are diagrams illustrating the method for processing a substrate of FIG. 9.
Figure 10B:
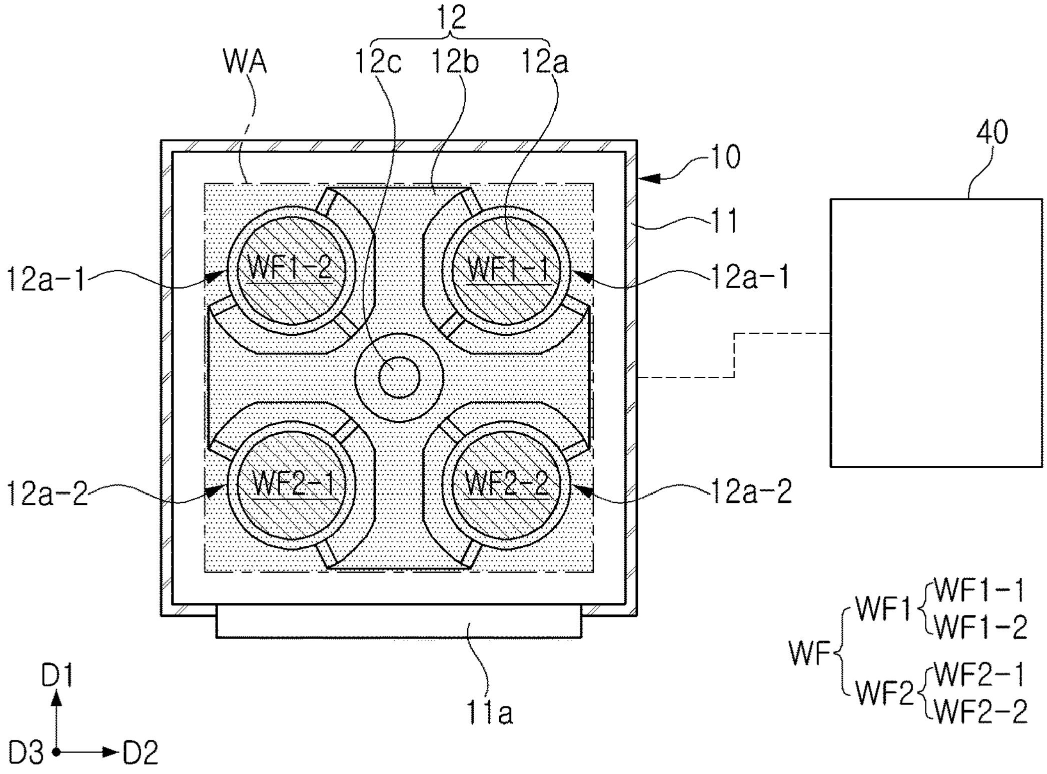

FIGS. 10A and 10B are diagrams illustrating the method for processing a substrate of FIG. 9. FIG. 10A is a diagram for illustrating operations S121 and S122. FIG. 10B is a diagram for illustrating operations S123 and S124.

Referring to FIGS. 9, 10A, and 10B, the surface processing operation of the substrate WF (S120) of an example embodiment may include: an operation of supplying a first pretreatment gas to a process chamber 11 (S121), an operation of surface processing a plurality of first substrates WF1 using first plasma generated from the first pretreatment gas (S122), an operation of supplying a second pretreatment gas to the process chamber 11 (S123), and an operation of surface processing a plurality of first substrates WF1 and a plurality of second substrates WF2 using second plasma generated from a second pretreatment gas (S124).

Specifically, in order to selectively surface-process the plurality of first substrates WF1, the first pretreatment gas and the first plasma may be provided only to a local region LA within the process chamber 11. The plurality of first substrates WF1 may be positioned adjacently to an opposite side of one side of the process chamber in which a gate 11*a* for loading and unloading the substrates WF is provided. The plurality of second substrates WF2 may be positioned adjacently to the gate 11*a* of the process chamber 11. The first pretreatment gas and the first plasma may not be provided to a region in which the plurality of second substrates WF2 are positioned. The first pretreatment gas may be, for example, Ar, but the present inventive concept is not limited thereto. As described above, a large amount of hydroxyl groups may be generated on the surfaces of the plurality of first substrates WF1 by the first pretreatment gas.

Additionally, in order to surface-process both the plurality of first substrates WF1 and the plurality of second substrates WF2, the second pretreatment gas and the second plasma may be provided to an entire area WA in the process chamber 11. Here, the entire area WA means an area in which both the plurality of first substrates WF1 and the plurality of second substrates WF2 are exposed to the second pretreatment gas and the second plasma.

As described above, only the plurality of first substrates WF1 loaded into the process chamber 11 are first primarily surface processed, and then the plurality of first substrates WF1 and the plurality of second substrates WF2 are secondarily surface processed, a consumption amount of the hard mask between the plurality of first substrates WF1 and the plurality of second substrates WF2 may be controlled to substantially the same level.

In the substrate processing system according to an example embodiment, the control unit 40 may control the gas supply unit 14 and the gas distribution unit 13 so that a first operation in which first substrates WF1 disposed on first stations 12*a*-1 are surface processed by a pretreatment gas, a second operation in which second substrates WF2 disposed on second stations 12*a*-2 are surface processed, and a third operation in which a thin film is deposited on the plurality of substrates WF by a reactive gas, are sequentially performed.

Figure 11A:
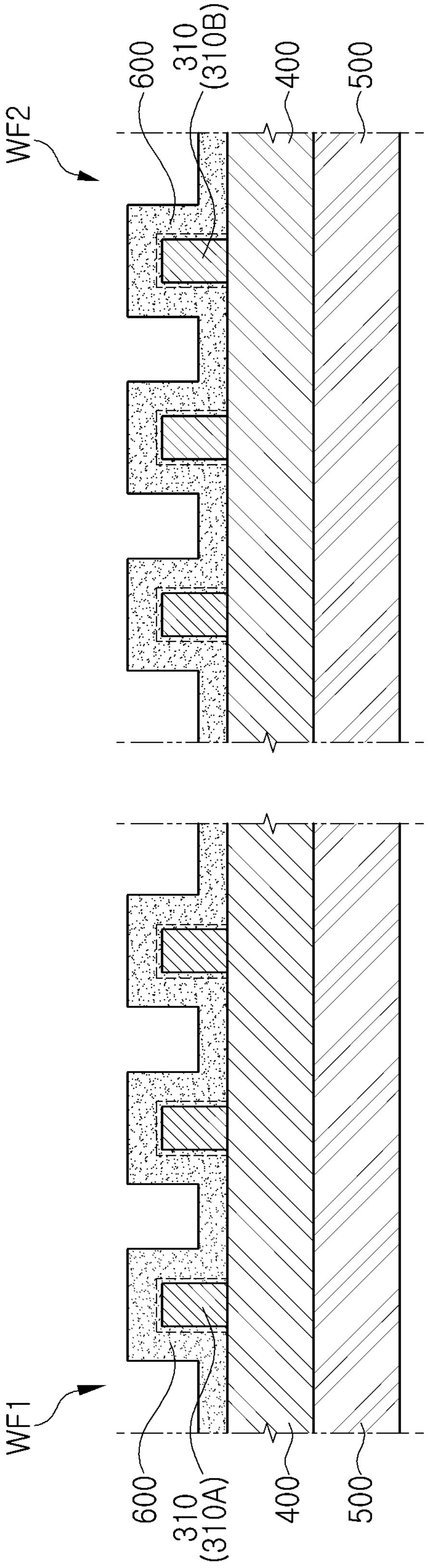
FIGS. 11A to 11E are diagrams illustrating a difference in critical dimensions of final pattern structures among a plurality of substrates when a method for processing a substrate to an example embodiment is applied.

FIGS. 11A to 11E are diagrams illustrating a difference in critical dimensions (CD) of final pattern structures among a plurality of substrates when a method for processing a substrate according to an example embodiment (the method for processing a substrate of FIG. 9) is applied. FIG. 11A is a diagram for illustrating a deposition process performed on first substrates WF1 and second substrates WF2 to which the surface processing operation S120 of the substrate WF described with reference to FIGS. 9, 10A, and 10B is applied. FIGS. 11B to 11E are views for illustrating subsequent processes performed on the first and second substrates WF1 and WF2 after a deposition process is completed.

Figure 12:
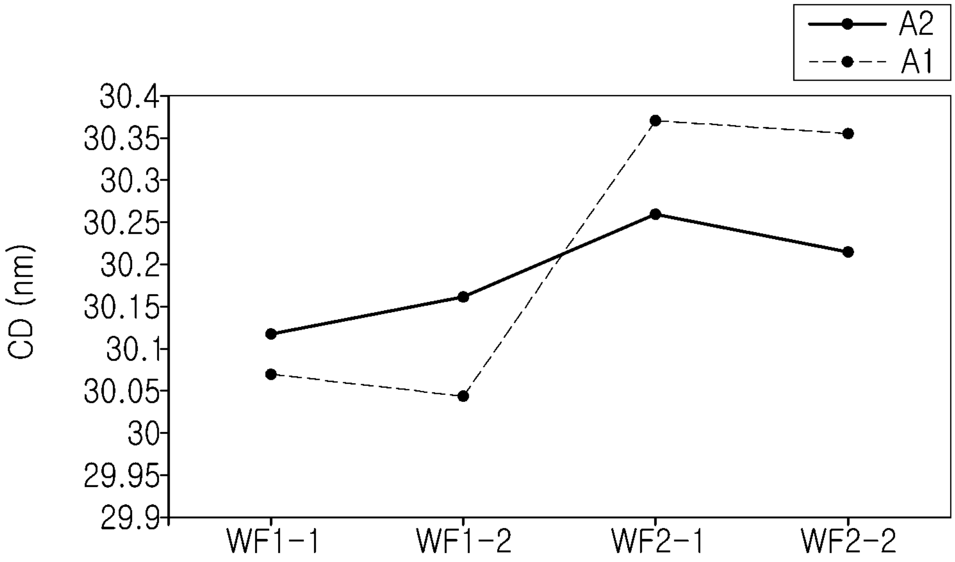
FIG. 12 is a graph illustrating a difference in critical dimensions of final pattern structures among a plurality of substrates after performing a method for processing a substrate according to an exemplary embodiment.

FIG. 12 is a graph illustrating a difference in critical dimensions (CD) of final pattern structures among a plurality of substrates after performing the method for processing a substrate according to an example embodiment. A1 is a graph illustrating a distribution of the critical dimension (CD) of the comparative example. A2 is a graph illustrating a distribution of the critical dimension (CD) of the exemplary embodiment.

Referring to FIG. 11A, a thin film 600 may be formed on first substrates WF1 and second substrates WF2. The first substrates WF1 and the second substrates WF2 may include a semiconductor layer 500, a conductive layer 400, and mask patterns 310. The mask patterns 310 may be hard mask layers patterned with a predetermined width d and an interval. The mask patterns 310 may include first mask pattern 310A and second mask patterns 310B. The first mask patterns 310A of the first substrates WF1 and the second mask patterns 310B of the second substrates WF2 may be formed to have substantially the same width d. The thin film 600 may be an atomic layer deposition (ALD) layer formed using a precursor (e.g., DIPAS) and plasma (e.g., $O_2$ plasma) generated from a reactive gas. As described above, in the process of depositing the thin film 600, the mask patterns 310 may be consumed, and in particular, consumption of the first substrates WF1 preloaded into the process chamber 11 may further be relatively increased. However, consumption of the first mask patterns 310A and the second mask patterns 310B may be controlled to a similar level by the first and second surface processing described with reference to FIGS. 9, 10A, and 10B. As a result thereof, in the process of depositing the thin film 600, the first mask patterns 310A may be consumed with a first width d1, and the second mask patterns 310B may be consumed with a second width d2, to a level substantially the same as the first width d1. For example, widths of the first mask patterns 310A may be reduced from the width d to the first width d1, and widths of the second mask patterns 310B may be reduced from the width d to the second width d2. Here, the level of "substantially the same level" means a level that a difference between the first width d1 and the second width d2 is significantly reduced compared to the case in which surface processing is not performed, and thus a distribution of critical dimensions CD or median critical dimensions MCD of final pattern structures 410 formed through a subsequent process is reduced. When the thin film 600 is formed to a target thickness by performing n cycles of the deposition process, the first substrates WF1 and the second substrates WF2 may be unloaded from the process chamber 11 and used in a subsequent process.

Figure 11B:
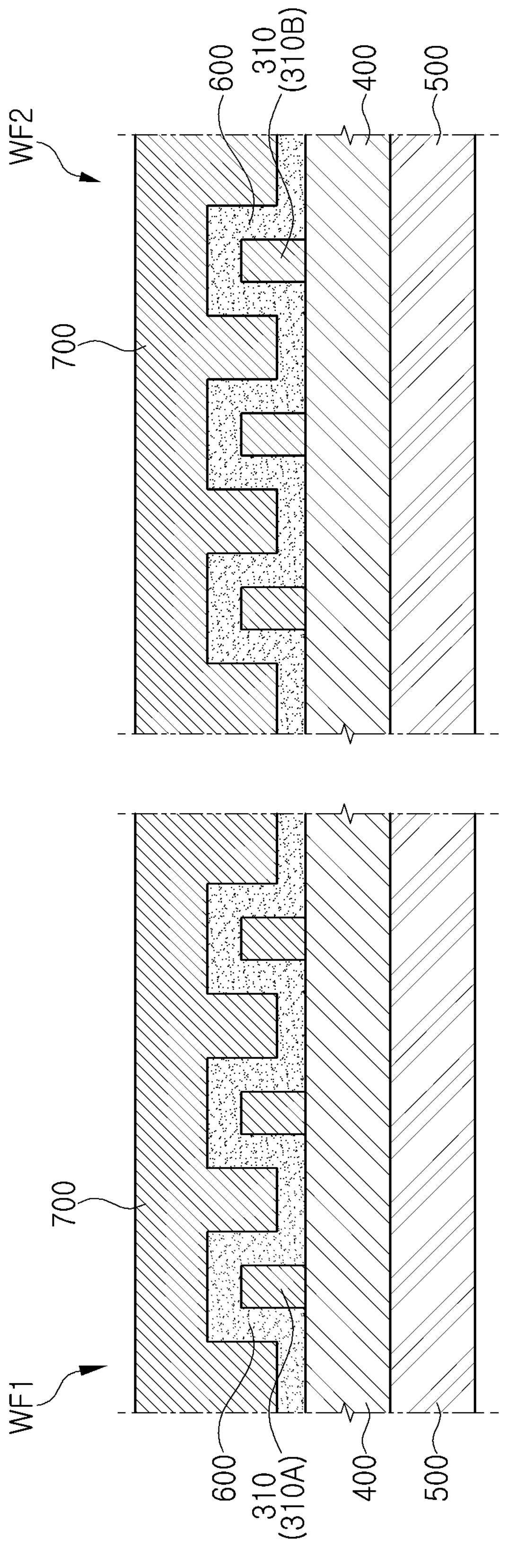

Referring to FIG. 11B, a preliminary mask pattern layer 700 may be formed on the mask patterns 310. The preliminary mask pattern layer 700 may be a hard mask layer formed through a spin coating process or another deposition process. The preliminary mask pattern layer 700 may be formed of, for example, a hydrocarbon compound having a high carbon content (e.g., about 85 to 99% by weight based on the total weight) or a derivative thereof. The preliminary mask pattern layer 700 may fill space between the mask patterns 310.

Figure 11C:
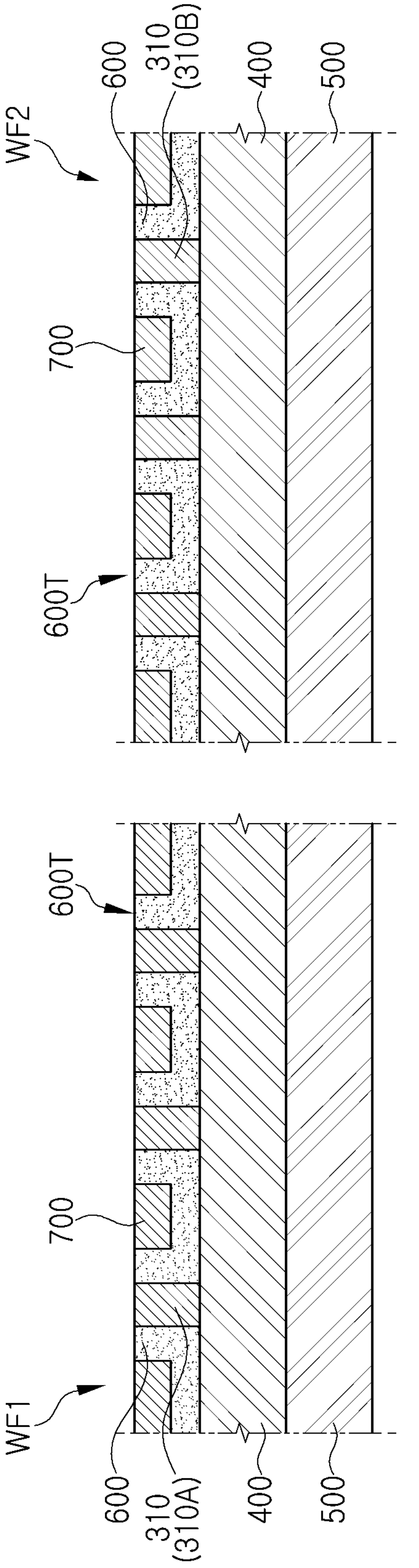

Referring to FIG. 11C, after performing subsequent processes, portions of the preliminary mask pattern layer 700 and the thin film 600 may be removed to expose the mask patterns 310. The preliminary mask pattern layer 700 and the thin film 600 may be removed using a dry or wet etching process, a stripping process, an ashing process, or the like. Upper ends 600T of the thin film 600 surrounding the mask patterns 310 may be exposed from the preliminary mask pattern layer 700. The mask patterns 310 may be removed leaving the spacer layers 610. The mask patterns 310 may be removed using a dry or wet etching process, a stripping process, an ashing process, or the like. The spacer layers 610 may not be etched according to etching selectivity. The spacer layers 610 may be patterned to have internal preliminary gaps sa1 and sa2 and external preliminary gaps sb1 and sb2. The first spacer layers 610A may be patterned with a first internal preliminary spacing sa1 and a first external preliminary spacing sb1, and the second spacer layers 610B may be patterned with a second internal preliminary spacing sa2 and a second external preliminary spacing sb2. As described with reference to FIG. 11A, as a result of controlling the consumption of the first mask patterns 310A and the second mask patterns 310B to a similar level, a difference between the first internal preliminary spacing sa1 and the second internal preliminary spacing sa2 may be reduced, and a difference between the first external preliminary spacing sb1 and the second external preliminary spacing sb2 may be reduced, as compared to the case in which the surface processing is not performed (see FIG. 2D).

Figure 11D:
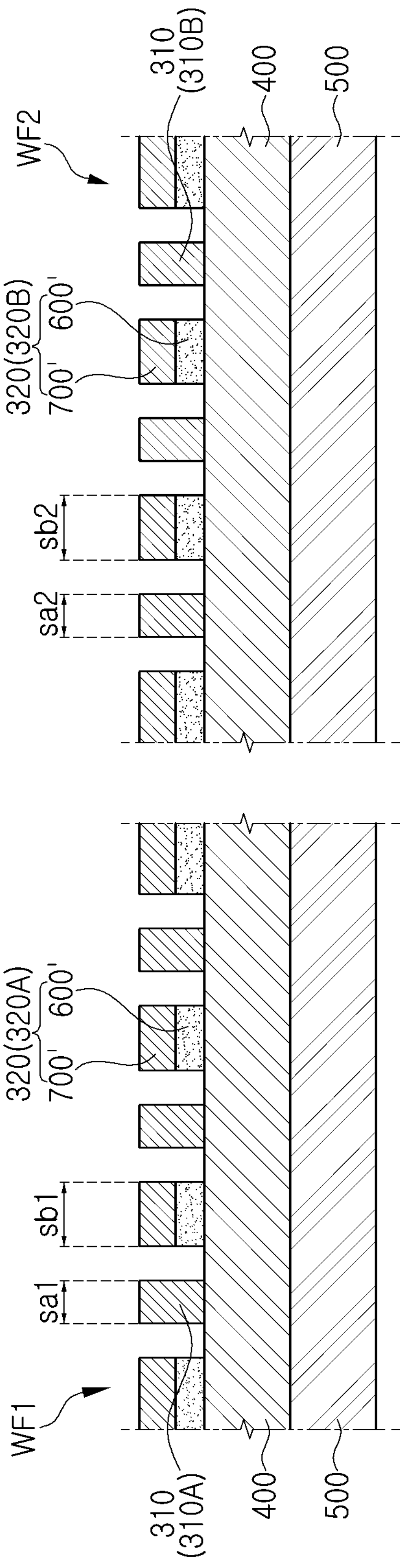

Referring to FIG. 11D, subsequent mask patterns 320 may be formed between preceding mask patterns 310. The subsequent mask patterns 320 may be formed by removing a portion of the thin film 600 filling a gap between the preceding mask patterns 310 and the preliminary mask pattern layer 700. A portion of the thin film 600 may be removed using an anisotropic reactive ion etching (RIE) process. The mask patterns 310 may not be etched according to etching selectivity. The subsequent mask patterns 320 may include a remaining portion 700' of the preliminary mask pattern layer 700 and a remaining portion 600' of the thin film 600. The subsequent mask patterns 320 of the first and second wafers WF1 and WF2 may be patterned to have subsequent widths sb1 and sb2, respectively. As described with reference to FIG. 11A, as a result of controlling the consumption of the first mask patterns 310A and the second mask patterns 310B to a similar level, a difference between a first preceding width sa1 of the first mask patterns 310A and a second preceding width sa2 of the second mask patterns 310B may be reduced, as compared to the case in which surface processing is not performed (see FIG. 2E). In addition, a difference between a first subsequent width sa1 of the first subsequent mask patterns 320A and a second subsequent width sa2 of the second subsequent mask patterns 320B may be reduced.

Figure 11E:
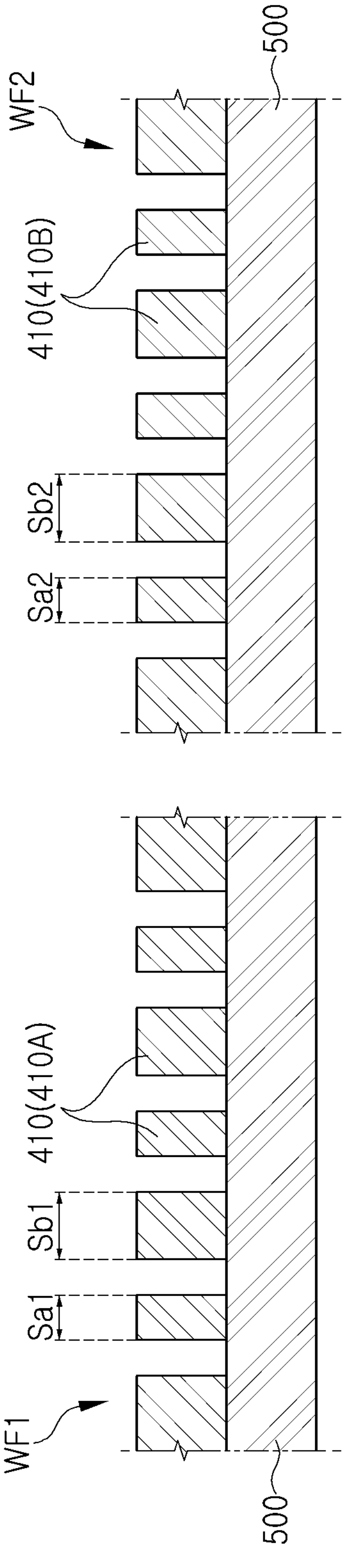

Referring to FIG. 11E, final pattern structures 410 obtained by transferring the preceding mask patterns 310 and the subsequent mask patterns 320 may be formed. The final pattern structures 410 may include first final pattern structures 410A of the first wafers WF1 and second final pattern structures 410B of the second wafers WF2. The final pattern structures 410 may be formed by performing an etching process using the preceding mask patterns 310 and the subsequent mask patterns 320 as etching masks. The final pattern structures 410 may have preceding line widths Sa1 and Sa2 corresponding to the preceding widths sa1 and sa2 of the preceding first and second mask patterns 310A and 310B, respectively, and subsequent line widths Sb1 and Sb2, corresponding to the subsequent widths sb1 and sb2 of the first and second subsequent mask patterns 320A and 320B, respectively. The first final pattern structures 410A may have a first preceding line width Sa1 and a first subsequent line width Sb1, and the second final pattern structures 410B may have a second preceding line width Sa2 and a second subsequent line width Sb2. As described with reference to FIG. 11D, as a result that the difference in widths between the preceding mask patterns 310 and the subsequent mask patterns 320 between the first substrate WF1 and the second substrate WF2 is reduced, a difference between the first preceding width Sa1 and the second preceding width Sa2 may be reduced and a difference between the first subsequent line width Sb1 and the second subsequent line width Sb2 may be reduced, as compared to the case in which surface processing is not performed (see FIG. 2F).

Referring to FIG. 12, in the substrates WF1-1, WF1-2, WF2-1, and WF2-2, to which the method for processing a substrate of an exemplary embodiment is applied, the distribution of critical dimensions CD of the final pattern structures may be obtained (A2). It can be seen that critical dimensions CD of the 1-1 substrate WF1-1 and the 1-2 substrate WF1-2 remaining in the process chamber for a relatively long time are increased, and critical dimensions CD of the 2-1 substrate WF2-1 and the 2-2 substrate WF2-2 decrease, as compared to the graph A1 of Comparative Example in which surface processing is not performed. As a result, it can be seen that the difference in critical dimensions CD between the first substrates WF1-land WF1-2 and the second substrates WF2-1 and WF2-2 is reduced (decreasing from about 0.3 nm or more to about 0.25 nm or less). The critical dimension CD measured in FIG. 12 is a result of measuring the median critical dimension MCD. As described above, in the substrate processing method according to the exemplary embodiment, by relatively greatly suppressing consumption of a substrate (e.g., a hard mask) in the first substrates WF1, first loaded into the substrate processing apparatus 10, a consumption amount of the hard mask between the substrates WF1 and the second substrates WF2 may be controlled to a substantially similar level. As a result thereof, the distribution of the critical dimension (CD) of the final pattern structures between the first substrates WF1 and the second substrates WF2, for example, the distribution of the median critical dimension (MCD) may be reduced, and controlled to approach a target critical dimension.

Figure 13:
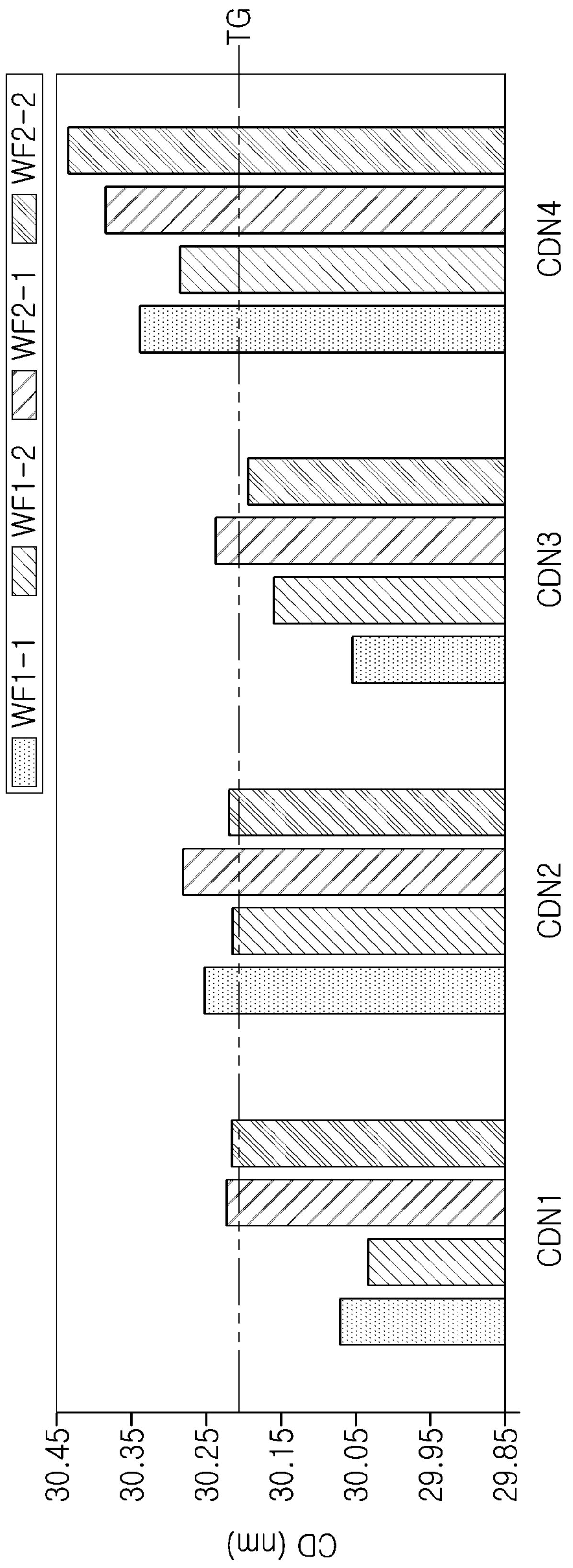
FIG. 13 is a graph illustrating a difference in critical dimensions of final pattern structures among a plurality of substrates according to conditions of a pretreatment process.

FIG. 13 is a graph illustrating a difference between critical dimensions CD of final pattern structures between a plurality of substrates WF1-1, WF1-2, WF2-1, and WF2-2 according to conditions of pretreatment processes CDN1, CDN2, CDN3, and CDN4. The first condition (CDN1) is a case in which no surface processing is applied. The second condition (CDN2) is a case in which primary surface processing and secondary surface processing are performed for 1 second, respectively. The third condition (CDN3) is a case in which primary surface processing is performed for 2 seconds and secondary surface processing is performed for 1 second. The fourth condition (CDN4) is a case in which only primary surface processing is performed for 2 seconds. The primary surface processing was applied with a plasma power of about 200 W, and the secondary surface processing was applied with a plasma power of about 400 W.

Referring to FIG. 13, a maximum value of a difference in critical dimensions CD between the first substrates WF1-1 and WF1-2 and the second substrates WF2-1 and WF2-2 under the first condition CND1 is about 0.17 nm. A maximum value of a difference in critical dimensions CD between the first substrates WF1-1 and WF1-2 and the second substrates WF2-1 and WF2-2 under the second condition CND2 is about 0.03 nm. A maximum value of a difference in critical dimensions CD between the first substrates WF1-1 and WF1-2 and the second substrates WF2-1 and WF2-2 under the third condition CND3 is about 0.18 nm. A maximum value of a difference in critical dimensions CD between the first substrates WF1-1 and WF1-2 and the second substrates WF2-1 and WF2-2 under the fourth condition CND4 is about 0.15 nm. It can be seen that the critical dimensions CD of each of the first substrates WF1-1 and WF1-2 and the second substrates WF2-1 and WF2-2 under the second condition CDN2 are all formed close to a target value TG. In addition, it can be seen that the difference in critical dimensions (CD) between the first and second substrates WF1-1 and WF1-2 and the second substrates WF2-1 and WF2-2 is the smallest under the second condition (CDN2).

As set forth above, according to example embodiments of the present inventive concept, it is possible to provide a method and system for processing a substrate in which a difference in consumption between a plurality of substrates is reduced during forming a thin film, by selectively surface-processing preloaded substrates among a plurality of substrates.

The various and advantageous advantages and effects of the present inventive concept are not limited to the above description, and may be more easily understood in the course of describing the specific embodiments of the present inventive concept. While example embodiments have been shown and described above, it will be apparent to those skilled in the art that modifications and variations could be made without departing from the scope of the present inventive concept, as defined by the appended claims.

While example embodiments have been shown and described above, it will be apparent to those skilled in the art that modifications and variations could be made without departing from the scope of the present inventive concept as defined by the appended claims.

What is claimed is:

1. A method for processing a substrate, comprising:

loading a plurality of first substrates and a plurality of second substrates on which mask patterns are formed into a process chamber;

supplying a first pretreatment gas into the process chamber;

surface processing the plurality of first substrates using first plasma generated from the first pretreatment gas;

supplying a second pretreatment gas into the process chamber;

surface processing the plurality of first substrates and the plurality of second substrates using second plasma generated from the second pretreatment gas;

supplying precursors to be adsorbed onto each of the plurality of first substrates and the plurality of second substrates into the process chamber;

supplying a reactive gas into the process chamber; and depositing a thin film covering the mask patterns on a surface of each of the plurality of first substrates and the plurality of second substrates using third plasma generated from the reactive gas and the precursors.

2. The method for processing the substrate of claim 1, wherein the plurality of first substrates are loaded into the process chamber prior to the plurality of second substrates.

3. The method for processing the substrate of claim 1, wherein the mask patterns comprise at least one of a hydrocarbon compound and a derivative thereof.

4. The method for processing the substrate of claim 1, wherein a hydroxyl group is generated on a surface of each of the mask patterns by the first and second plasma.

5. The method for processing the substrate of claim 4,
wherein the precursors react with the hydroxyl group and are adsorbed onto the surface of each of the mask patterns, and
wherein the thin film extending along the surface of each of the mask patterns is deposited by the third plasma reacting with the precursors.

6. The method for processing the substrate of claim 1, wherein, after the thin film is deposited, a first width of first mask patterns on the plurality of first substrates among the mask patterns is substantially the same as a second width of second mask patterns on the plurality of second substrates.

7. The method for processing the substrate of claim 1, wherein the first and second pretreatment gases comprise an inert gas.

8. The method for processing the substrate of claim 7, wherein the inert gas comprises at least one of He, Ne, Ar, Kr, and Xe.

9. The method for processing the substrate of claim 1,
wherein a gate for loading and unloading the plurality of first substrates and the plurality of second substrates is provided on one side of the process chamber, and
the plurality of first substrates are positioned adjacently to an opposite side of the one side of the process chamber.

10. The method for processing the substrate of claim 9, wherein the first plasma is provided only to a local region within the process chamber in which the plurality of first substrates are disposed.

11. The method for processing the substrate of claim 9,
wherein the plurality of second substrates are positioned adjacently to the one side of the process chamber, and
wherein the first plasma is not provided to a region in which the plurality of second substrates are disposed.

12. The method for processing the substrate of claim 1, wherein the second plasma is provided to an entire region within the process chamber in which the plurality of first substrates and the plurality of second substrates are disposed.

13. The method for processing the substrate of claim 1, wherein the precursors comprise at least one of aminosilanes, silylamines, isocyanatesilanes, isotonatesilanes, inorganic silanes, silane-containing hydroxides, and silane-containing alkoxides.

14. The method for processing the substrate of claim 1, wherein the reactive gas comprises at least one of oxygen ($O_2$), carbon dioxide ($CO_2$), and nitrous oxide ($N_2O$).

15. A method for processing a substrate, comprising:
loading a plurality of substrates into a process chamber, the plurality of substrates including first substrates that are first loaded and second substrates that are loaded after the first substrates;
supplying a pretreatment gas into the process chamber;
selectively surface processing the first substrates among the plurality of substrates using plasma generated from the pretreatment gas;
after selectively processing the first substrates, surface processing all of the plurality of substrates together using plasma generated from the pretreatment gas,
supplying precursors to be adsorbed onto each of the plurality of substrates into the process chamber;
supplying a reactive gas into the process chamber; and
depositing a thin film on a surface of each of the plurality of substrates using plasma generated from the reactive gas and the precursors.

16. A system for processing a substrate, comprising:
a process chamber including a gate for loading and unloading a plurality of substrates, the plurality of substrates including first substrates and second substrates;
a substrate support unit disposed within the process chamber, and including first stations spaced apart from the gate in a first direction, and second stations between the first stations and the gate;
a gas distribution unit configured to spray a pretreatment gas and a reactive gas required for plasma generation onto the plurality of substrates;
a gas supply unit configured to supply the pretreatment gas and the reactive gas; and
a control unit controlling the gas supply unit and the gas distribution unit so that a first operation in which the first substrates disposed on the first stations are surface processed using plasma generated from the pretreatment gas, a second operation in which the first substrates and the second substrates disposed on the second stations are surface processed at the same time using plasma generated from the pretreatment gas, and a third operation in which a thin film is deposited on the plurality of substrates using plasma generated from the reactive gas,
wherein the first operation, the second operation, and the third operation are sequentially performed.

17. The system for processing the substrate of claim 16,
wherein the first stations are arranged in a line in a second direction, crossing the first direction, and
wherein the second stations are arranged in a line in the second direction between the first stations and the gate.

18. The system for processing the substrate of claim 16, wherein the plurality of substrates comprise mask patterns formed of at least one of a hydrocarbon compound and a derivative thereof.

* * * * *